(12) United States Patent
Sekine et al.

(10) Patent No.: US 12,495,635 B2
(45) Date of Patent: Dec. 9, 2025

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventors: Hiroshi Sekine, Kanagawa (JP); Kazuhiro Morimoto, Kanagawa (JP); Junji Iwata, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 567 days.

(21) Appl. No.: 18/145,076

(22) Filed: Dec. 22, 2022

(65) Prior Publication Data

US 2023/0215899 A1 Jul. 6, 2023

(30) Foreign Application Priority Data

Jan. 1, 2022 (JP) ................................. 2022-000008

(51) Int. Cl.
*H10F 39/00* (2025.01)
(52) U.S. Cl.
CPC ......... *H10F 39/811* (2025.01); *H10F 39/809* (2025.01)
(58) Field of Classification Search
CPC .......... H10D 8/055; H10D 8/40; H10D 8/024; H10F 30/225
See application file for complete search history.

(56) References Cited

U.S. PATENT DOCUMENTS

| 8,648,944 B2 | 2/2014 | Iwata |
| 8,697,500 B2 | 4/2014 | Iwata |
| 9,543,340 B2 | 1/2017 | Iwata |

(Continued)

FOREIGN PATENT DOCUMENTS

| JP | 2018-201005 A | 12/2018 |
| JP | 2019-102619 A | 6/2019 |

(Continued)

OTHER PUBLICATIONS

Explanation of Circumstances Concerning Accelerated Examination, dated Mar. 3, 2023, in Japanese Patent Application No. 2022-184314.

(Continued)

*Primary Examiner* — Christine S. Kim
*Assistant Examiner* — Cole Leon Lindsey
(74) *Attorney, Agent, or Firm* — Venable LLP

(57) ABSTRACT

A photoelectric conversion apparatus includes a semiconductor layer having an avalanche photodiode, and a wiring structure electrically connected to the semiconductor layer. In a plan view, the photoelectric conversion apparatus comprises a pixel region including the avalanche photodiode, and a peripheral region located between the pixel region and an outer edge of the photoelectric conversion apparatus. A third wiring layer is located between a first wiring layer and a second wiring layer. The first wiring layer includes, in the peripheral region, a first conductive part for transmitting an anode potential of the avalanche photodiode. The second wiring layer includes, in the peripheral region, a second conductive part for transmitting a second potential different from the anode potential. The first conductive part and the second conductive part overlap in the plan view.

20 Claims, 23 Drawing Sheets

(56) References Cited

U.S. PATENT DOCUMENTS

| | | |
|---|---|---|
| 9,979,916 B2 | 5/2018 | Hiyama et al. |
| 10,009,560 B2 | 6/2018 | Kobayashi et al. |
| 10,121,816 B2 | 11/2018 | Iwata |
| 10,186,532 B2 | 1/2019 | Kobayashi et al. |
| 10,205,894 B2 | 2/2019 | Kawabata et al. |
| 10,483,307 B2 | 11/2019 | Sekine et al. |
| 10,535,688 B2 | 1/2020 | Onuki et al. |
| 10,622,397 B2 | 4/2020 | Ishino et al. |
| 10,645,322 B2 | 5/2020 | Sekine |
| 10,771,718 B2 | 9/2020 | Kawabata et al. |
| 10,805,563 B2 | 10/2020 | Ikeda et al. |
| 10,818,715 B2 | 10/2020 | Iwata et al. |
| 10,833,207 B2 | 11/2020 | Iwata |
| 10,848,695 B2 | 11/2020 | Miki et al. |
| 11,056,519 B2 | 7/2021 | Inui et al. |
| 11,056,520 B2 | 7/2021 | Onuki et al. |
| 11,094,731 B2 | 8/2021 | Seto et al. |
| 11,297,273 B2 | 4/2022 | Sekine et al. |
| 11,393,870 B2 | 7/2022 | Inui et al. |
| 2015/0255495 A1 | 9/2015 | Park |
| 2018/0152657 A1 | 5/2018 | Miyazawa |
| 2019/0006399 A1 | 1/2019 | Otake et al. |
| 2020/0075643 A1* | 3/2020 | Han .................... H10F 39/8027 |
| 2020/0127030 A1* | 4/2020 | Ogawa ................. H10F 39/024 |
| 2021/0043792 A1 | 2/2021 | Iwata |
| 2021/0296383 A1 | 9/2021 | Inui et al. |
| 2022/0037380 A1 | 2/2022 | Shinohara et al. |
| 2022/0093662 A1 | 3/2022 | Shinohara et al. |
| 2022/0115366 A1 | 4/2022 | Ota et al. |
| 2022/0399390 A1* | 12/2022 | Washio ............... H10F 39/8057 |
| 2023/0038959 A1 | 2/2023 | Sekine et al. |
| 2023/0053980 A1 | 2/2023 | Shirahige et al. |

FOREIGN PATENT DOCUMENTS

| | | |
|---|---|---|
| JP | 2021-027277 A | 2/2021 |
| JP | 2021-061439 A | 4/2021 |
| JP | 2021-077708 A | 5/2021 |

OTHER PUBLICATIONS

U.S. Appl. No. 18/145,072, filed Dec. 22, 2022 (first named inventor: Hiroshi Sekine).

Office Action dated May 8, 2023, in Japanese Patent Application No. 2022-184314.

* cited by examiner

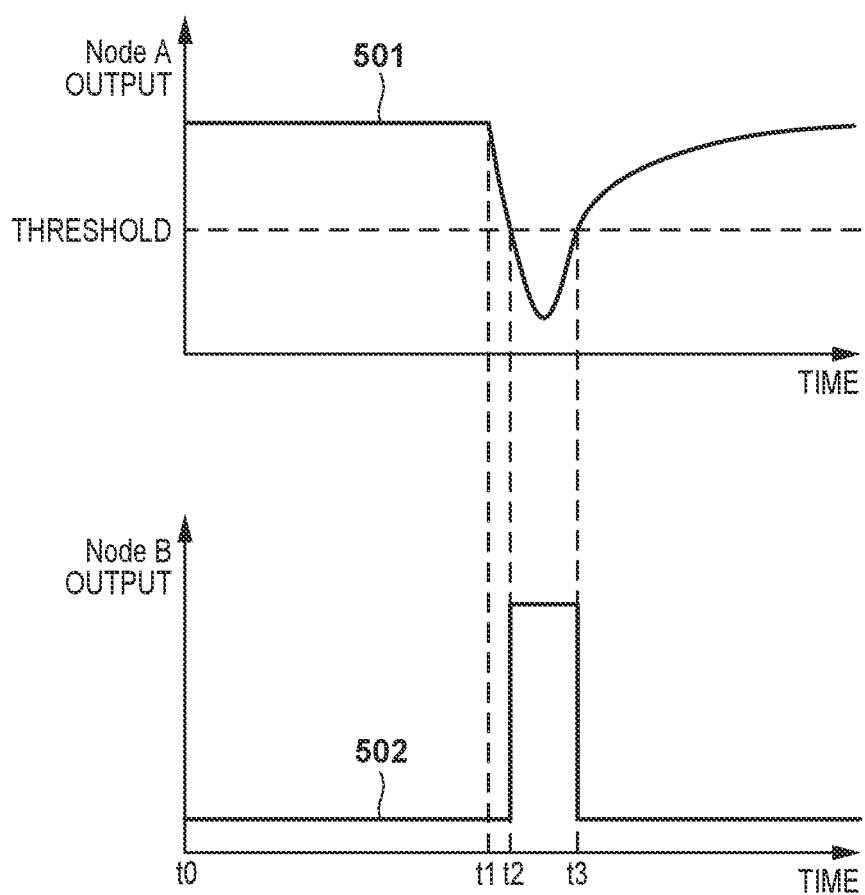

PHOTOELECTRIC CONVERSION APPARATUS AND PHOTOELECTRIC CONVERSION SYSTEM

BACKGROUND OF THE INVENTION

Field of the Invention

The present invention relates to a photoelectric conversion apparatus and a photoelectric conversion system.

Description of the Related Art

A photoelectric conversion apparatus having an avalanche photodiode capable of detecting photons on a pixel-by-pixel basis has been proposed. Japanese Patent Laid-Open No. 2018-201005 describes a photoelectric conversion apparatus formed by coupling a sensor substrate having an avalanche photodiode with a circuit substrate for processing signals. An operating voltage of about 20 to 30 V is applied to the avalanche photodiode. Depending on the configuration of the photoelectric conversion apparatus, operational failures can arise with ease due to the transmission of such high voltages.

SUMMARY OF THE INVENTION

Some aspects of the present disclosure provide a technique for improving a breakdown voltage performance of a photoelectric conversion apparatus. According to an embodiment, a photoelectric conversion apparatus is provided. The apparatus comprises a semiconductor layer having an avalanche photodiode, and a wiring structure electrically connected to the semiconductor layer. In a plan view relative to a boundary between the semiconductor layer and the wiring structure, the photoelectric conversion apparatus comprises a pixel region including the avalanche photodiode, and a peripheral region located between the pixel region and an outer edge of the photoelectric conversion apparatus. The wiring structure includes a first wiring layer, a second wiring layer, and a third wiring layer. The third wiring layer is located between the first wiring layer and the second wiring layer. The first wiring layer includes, in the peripheral region, a first conductive part for transmitting an anode potential of the avalanche photodiode. The second wiring layer includes, in the peripheral region, a second conductive part for transmitting a second potential different from the anode potential. The first conductive part and the second conductive part overlap in the plan view.

Further features of the present invention will become apparent from the following description of exemplary embodiments with reference to the attached drawings.

BRIEF DESCRIPTION OF THE DRAWINGS

FIG. 5 is a schematic diagram illustrating driving of a pixel circuit of a photoelectric conversion apparatus according to some embodiments.

DESCRIPTION OF THE EMBODIMENTS

Figure 1:
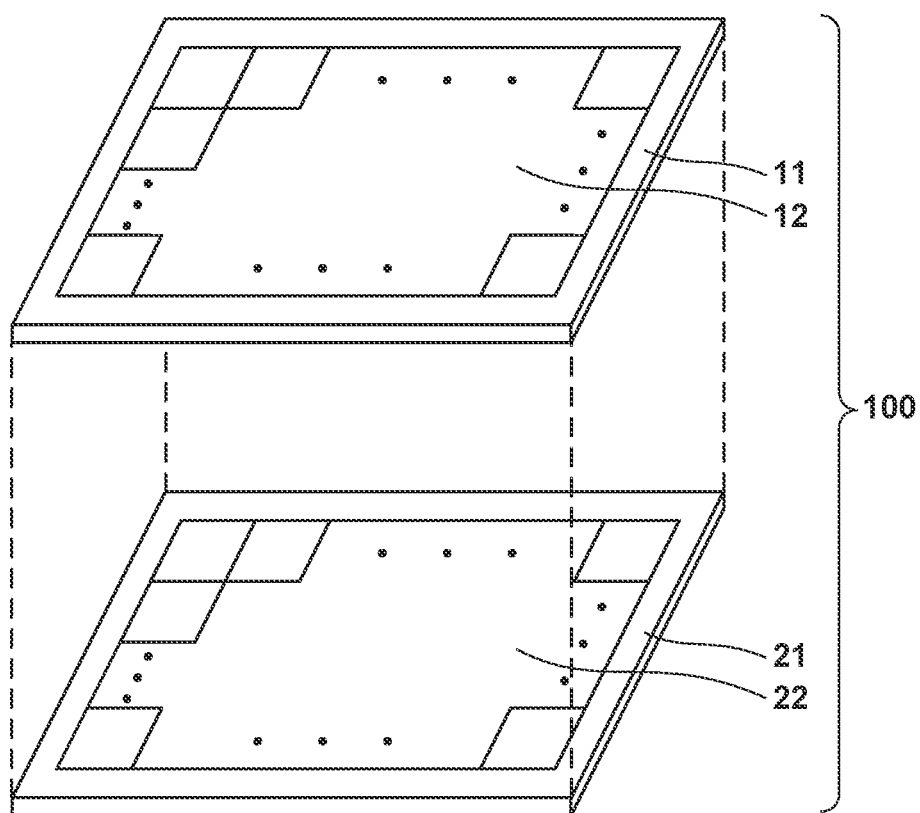
FIG. 1 is a schematic diagram of a photoelectric conversion apparatus according to some embodiments.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In the following descriptions, terms indicating specific directions or positions (e.g., "up", "down", "right", "left", and other terms including those terms) will be used as necessary. Such terms are used facilitate understanding of the embodiments with reference to the drawings. However, the technical scope of the present disclosure is not intended to be limited by the meanings of such terms.

In the following descriptions, the anode of an avalanche photodiode (denoted as "APD" hereinafter) is set to a fixed potential, and a signal is obtained from the cathode. As such, a semiconductor region of a first conductivity type, in which the majority carriers are charges of the same polarity as the signal charge, is an N-type semiconductor region, and a semiconductor region of a second conductivity type, in which the majority carriers are charges of a polarity different from the signal charge, is a P-type semiconductor region. The embodiments described below can also be applied when the cathode of the APD is set to a fixed potential and a signal is obtained from the anode. In this case, the semiconductor region of the first conductivity type, in which the majority carriers are charges of the same polarity as the signal charge, is the P-type semiconductor region, and the semiconductor region of the second conductivity type, in which the majority carriers are charges of a polarity different from the signal charge, is the N-type semiconductor region. Although the following will describe a case where one node of the APD is set to a fixed potential, the potentials of both nodes may vary.

When simply used in the present specification, the term "impurity concentration" means the net impurity concentration minus a part compensated for by impurities of the opposite conductivity type. In other words, "impurity concentration" refers to the net doping concentration. Regions where a P-type additive impurity concentration is higher than an N-type additive impurity concentration are P-type semiconductor regions. Conversely, regions where an N-type additive impurity concentration is higher than a P-type additive impurity concentration are N-type semiconductor regions.

Configurations common to each of the embodiments of a photoelectric conversion apparatus and a method of driving the same according to some embodiments will be described with reference to FIGS. 1 to 5. FIG. 1 is a diagram illustrating the configuration of a stacked-type photoelectric conversion apparatus 100 according to embodiments of the present disclosure. The photoelectric conversion apparatus 100 is configured by stacking and electrically connecting two substrates, namely a sensor substrate 11 and a circuit substrate 21. The sensor substrate 11 includes a first semiconductor layer having a photoelectric conversion element 102 (described later), and a first wiring structure. The circuit substrate 21 includes a second semiconductor layer having circuits such as a signal processing unit 103 and the like (described later), and a second wiring structure. The photoelectric conversion apparatus 100 is a back-illuminated photoelectric conversion apparatus that converts light incident on the photoelectric conversion element 102 from the side opposite from the side on which a signal processing circuit is located.

In the following descriptions, each of the sensor substrate 11 and circuit substrate 21 is a diced chip. However, these substrates are not limited to chips. For example, each substrate may be a wafer. Each substrate may be stacked in wafer form and then diced, or chips may be stacked and joined together after being formed into chips. A pixel region 12 is provided in the sensor substrate 11, and a circuit region 22 that processes signals detected in the pixel region 12 is provided in the circuit substrate 21.

Figure 2:
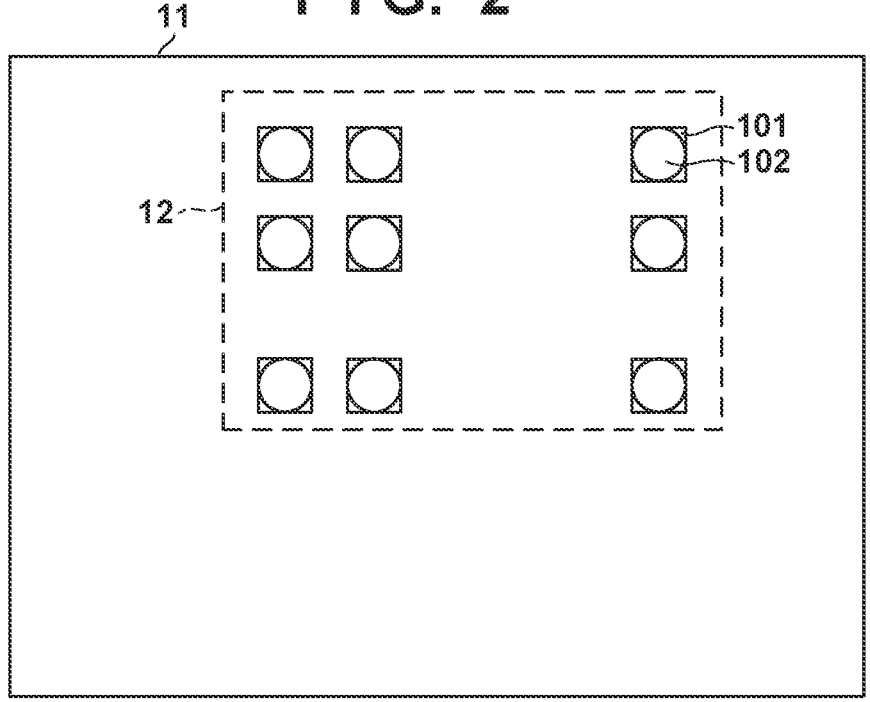
FIG. 2 is a schematic diagram of a PD substrate of a photoelectric conversion apparatus according to some embodiments.

FIG. 2 is a diagram illustrating an example of the arrangement of the sensor substrate 11. Pixels 101, each having the photoelectric conversion element 102 including an APD, are arranged in a two-dimensional array in plan view relative to the surface of the sensor substrate 11. The region where these plurality of pixels 101 are disposed is the pixel region 12. The pixels 101 are typically pixels for forming an image. However, when the photoelectric conversion apparatus 100 is used for Time of Flight (TOF), the pixels 101 do not necessarily have to form an image. In other words, the pixels 101 may be pixels for measuring the time of arrival of light and the amount of light.

Figure 3:
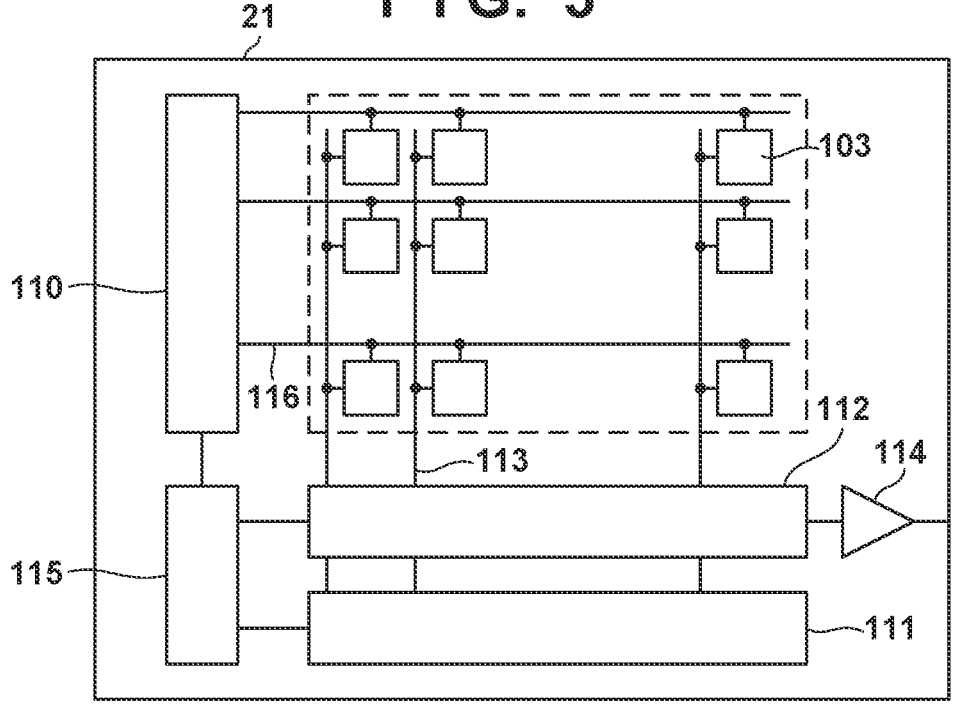
FIG. 3 is a schematic diagram of a circuit substrate of a photoelectric conversion apparatus according to some embodiments.

FIG. 3 is a configuration diagram illustrating the circuit substrate 21. The circuit substrate 21 includes the signal processing unit 103, a readout circuit 112, a control pulse generation unit 115, a horizontal scanning circuit unit 111, a vertical scanning circuit unit 110, and an output circuit 114. The circuit substrate 21 further includes signal lines 113 and drive lines 116. The photoelectric conversion element 102 in FIG. 2 and the signal processing unit 103 in FIG. 3 are electrically connected by connection wiring provided for each pixel.

The signal processing unit 103 processes signals based on a charge obtained by photoelectric conversion in the photoelectric conversion element 102 illustrated in FIG. 2. The vertical scanning circuit unit 110 receives control pulses supplied from the control pulse generation unit 115 and supplies control pulses to each pixel 101 through the corresponding drive line 116. The vertical scanning circuit unit 110 is constituted by logic circuits such as a shift register, an address decoder, and the like.

The signals output from the photoelectric conversion elements 102 of the pixels 101 are processed by the signal processing unit 103. The signal processing unit 103 includes a counter, memory, and the like. The memory holds the signals output from the photoelectric conversion elements 102 in digital format.

To read out the signals from the memory of each pixel in which the digital signals are held, the horizontal scanning circuit unit 111 inputs, to the signal processing unit 103, control pulses which select columns in sequence. The signal is output, on the signal line 113, from the signal processing unit 103 of the pixel selected by the vertical scanning circuit unit 110 to the readout circuit 112, for the selected column. The signals output to the readout circuit 112 are output to a recording unit or a signal processing unit outside the photoelectric conversion apparatus 100 through the output circuit 114.

In FIG. 2, the array of the photoelectric conversion elements 102 in the pixel region 12 may be one-dimensional. The effects of the present disclosure can also be achieved even if there is only one pixel 101, and the case where there is one pixel 101 is also included in the present disclosure. The function of the signal processing unit 103 does not necessarily have to be provided for each of the photoelectric conversion elements 102. For example, one signal processing unit 103 may be shared by a plurality of the photoelectric conversion elements 102, and the signal processing may be performed sequentially.

As illustrated in FIGS. 2 and 3, a plurality of the signal processing units 103 are provided in a region overlapping the pixel region 12 in plan view. The vertical scanning circuit unit 110, the horizontal scanning circuit unit 111, the readout circuit 112, the output circuit 114, and the control pulse generation unit 115 are disposed so as to overlap regions between the outer edges of the sensor substrate 11 and the outer edges of the pixel region 12 in plan view. In other words, the sensor substrate 11 has the pixel region 12, and a non-pixel region provided around the pixel region 12. The vertical scanning circuit unit 110, the horizontal scanning circuit unit 111, the readout circuit 112, the output circuit 114, and the control pulse generation unit 115 are provided in a region overlapping the non-pixel region in plan view. The arrangement of the signal lines 113, the readout circuit 112, and the output circuit 114 is not limited to the example in FIG. 3. For example, the signal lines 113 may be disposed extending in a row direction, and the readout circuit 112 may be arranged at the end of the signal lines 113.

Figure 4:
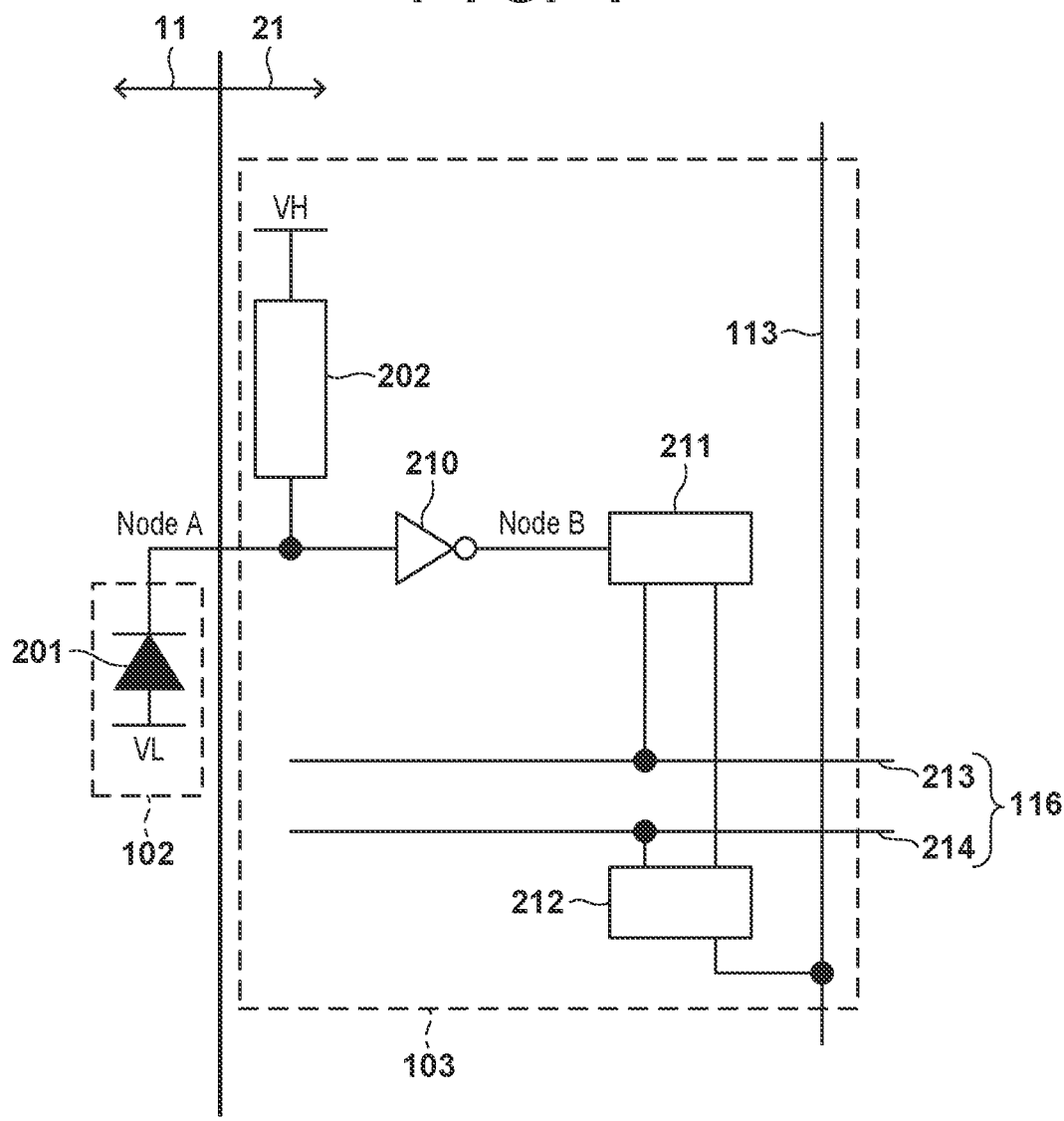
FIG. 4 is a diagram illustrating an example of the configuration of a pixel circuit of a photoelectric conversion apparatus according to some embodiments.

FIG. 4 is an example of a block diagram including an equivalent circuit of FIGS. 2 and 3. As described with reference to FIG. 2, the photoelectric conversion elements 102, each of which has an APD 201, are provided in the sensor substrate 11, while the other circuit elements are provided in the circuit substrate 21.

The APD 201 generates charge pairs according to incident light through photoelectric conversion. A voltage VL is supplied to the anode of the APD 201. The voltage VL supplied to the anode is sometimes called an "anode potential". The cathode of the APD 201 is supplied with a voltage VH that is higher than the voltage VL supplied to the anode. The voltage supplied to the cathode is sometimes called a "cathode potential". Reverse-bias voltages are supplied to the anode and the cathode such that the APD 201 operates with avalanche multiplication. By supplying voltages in such a state, the charge generated by the incident light undergoes avalanche multiplication, and an avalanche current is generated.

When a reverse-bias voltage is supplied, there are two modes, namely the Geiger mode, in which operations are performed with a potential difference between the anode and cathode being greater than the breakdown voltage, and the linear mode, in which operations are performed with a potential difference between the anode and cathode being near or lower than the breakdown voltage. An APD that operates in Geiger mode is called a Single Photon Avalanche Diode (SPAD). For example, the voltage VL is −30 V and the voltage VH is 1 V. The APD 201 may be operated in linear mode or in Geiger mode. In the case of a SPAD, the potential difference is greater than that of an APD in linear mode, and the effect of the breakdown voltage is more pronounced.

A quench element 202 is connected between a power line supplying the voltage VH and the APD 201. The quench element 202 functions as a load circuit (a quench circuit) during signal multiplication through avalanche multiplication, and suppresses avalanche multiplication by suppressing the voltage supplied to the APD 201 (a quench operation). The quench element 202 returns the voltage supplied to the APD 201 to the voltage VH (a recharge operation) by supplying current equivalent to the voltage drop caused by the quench operation.

The signal processing unit 103 includes a waveform shaping unit 210, a counter circuit 211, and a selection circuit 212. The waveform shaping unit 210 outputs a pulse signal obtained by shaping a change in the potential of the cathode of the APD 201 obtained during photon detection. For example, an inverter circuit is used as the waveform shaping unit 210. Although FIG. 4 illustrates an example of using a single inverter as the waveform shaping unit 210, a circuit having a plurality of inverters connected in series may be used, or another circuit that provides a waveform shaping effect may be used.

The counter circuit 211 counts the pulse signals output from the waveform shaping unit 210 and holds a count value. The signal held in the counter circuit 211 is reset in response to a control pulse supplied over a drive line 213.

The selection circuit 212 switches between electrically connecting and disconnecting the counter circuit 211 and the signal line 113 in response to control pulses supplied from the vertical scanning circuit unit 110, illustrated in FIG. 3, over a drive line 214, illustrated in FIG. 4. The selection circuit 212 includes, for example, a buffer circuit for outputting signals and the like.

A switch such as a transistor or the like may be disposed between the quench element 202 and the APD 201, between the photoelectric conversion element 102 and the signal processing unit 103, or the like, and the electrical connection may be switched using this switch. Similarly, the supply of the voltage VH or voltage VL supplied to the photoelectric conversion element 102 may be electrically switched using a switch such as a transistor or the like.

The example in FIG. 4 illustrates a configuration that uses the counter circuit 211. However, instead of the counter circuit 211, a time-to-digital converter ("TDC" hereinafter) and memory may be used to obtain the pulse detection timing. In this case, the timing of the generation of the pulse signal output from the waveform shaping unit 210 is converted to a digital signal by the TDC. Control pulses are supplied to the TDC over a drive line from the vertical scanning circuit unit 110 illustrated in FIG. 1 to measure the timing of the pulse signal. The TDC obtains, as a digital signal, a signal for a case where the input timing of the signal output from each pixel via the waveform shaping unit 210 is a relative time, using the control pulse as a reference.

FIG. 5 is a diagram schematically illustrating a relationship between APD operation and an output signal. In the descriptions referring to FIG. 5, the input node of the waveform shaping unit 210 is denoted as "Node A" and the output node of the waveform shaping unit 210 is denoted as "Node B". The graph 501 on the upper side of FIG. 5 illustrates changes in the waveform of Node A. Specifically, the horizontal axis of the graph 501 represents time, and the vertical axis of the graph 501 represents the voltage at Node A. The graph 502 on the lower side of FIG. 5 illustrates changes in the waveform of Node B. Specifically, the horizontal axis of the graph 502 represents time, and the vertical axis of the graph 502 represents the voltage at Node B.

Between time t0 and time t1, a potential difference between the voltage VH and the voltage VL is applied to the APD 201. When a photon is incident on the APD 201 at time t1, avalanche multiplication occurs in the APD 201, avalanche multiplication current flows to the quench element 202, and the voltage at Node A drops. The voltage drop becomes even larger, and at time t2, the voltage at Node A falls below a threshold, and the output of the waveform shaping unit 210 switches from low level to high level in response thereto. Thereafter, the avalanche multiplication of the APD 201 stops and the drop in the voltage at Node A stops as well. Then, current which compensates for the voltage drop from the voltage VL flows to Node A, and the voltage at Node A exceeds the threshold at time t3. The output of the waveform shaping unit 210 switches from high level to low level in response. In this manner, the part of the output waveform that is below a given threshold in Node A is shaped by the waveform shaping unit 210 and output as a signal in Node B.

First Embodiment

Figure 6A:
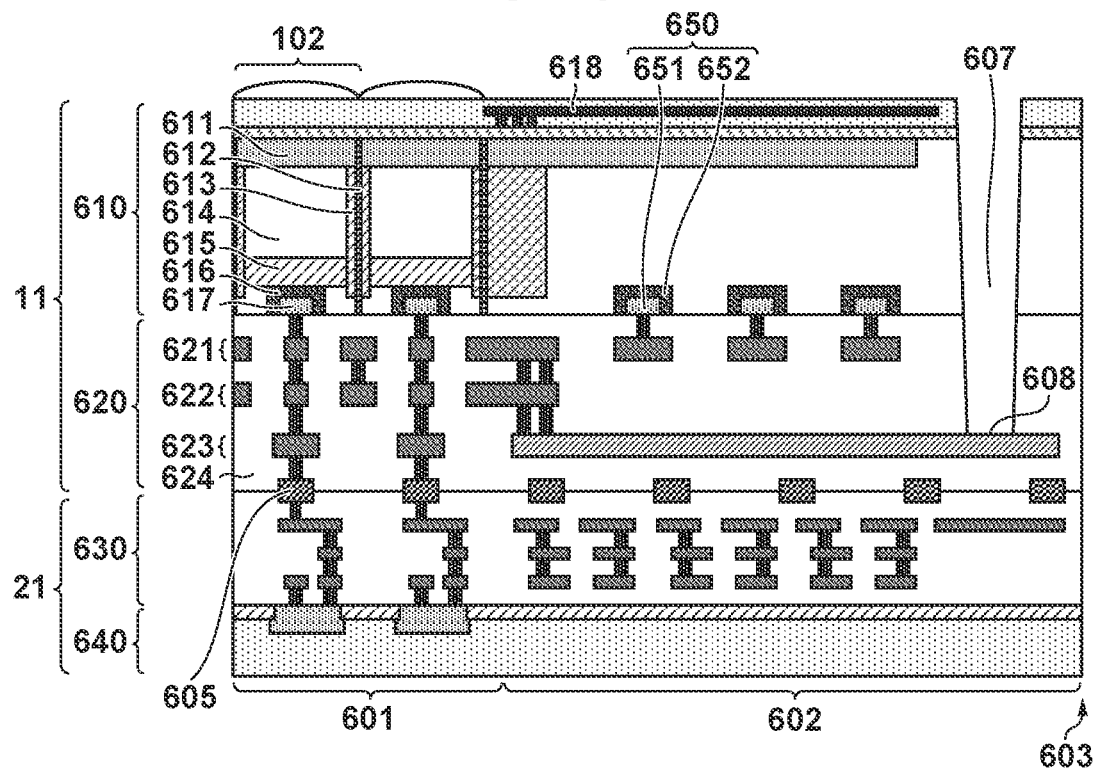
FIGS. 6A and 6B are cross-sectional views of a photoelectric conversion apparatus according to a first embodiment.
Figure 6B:
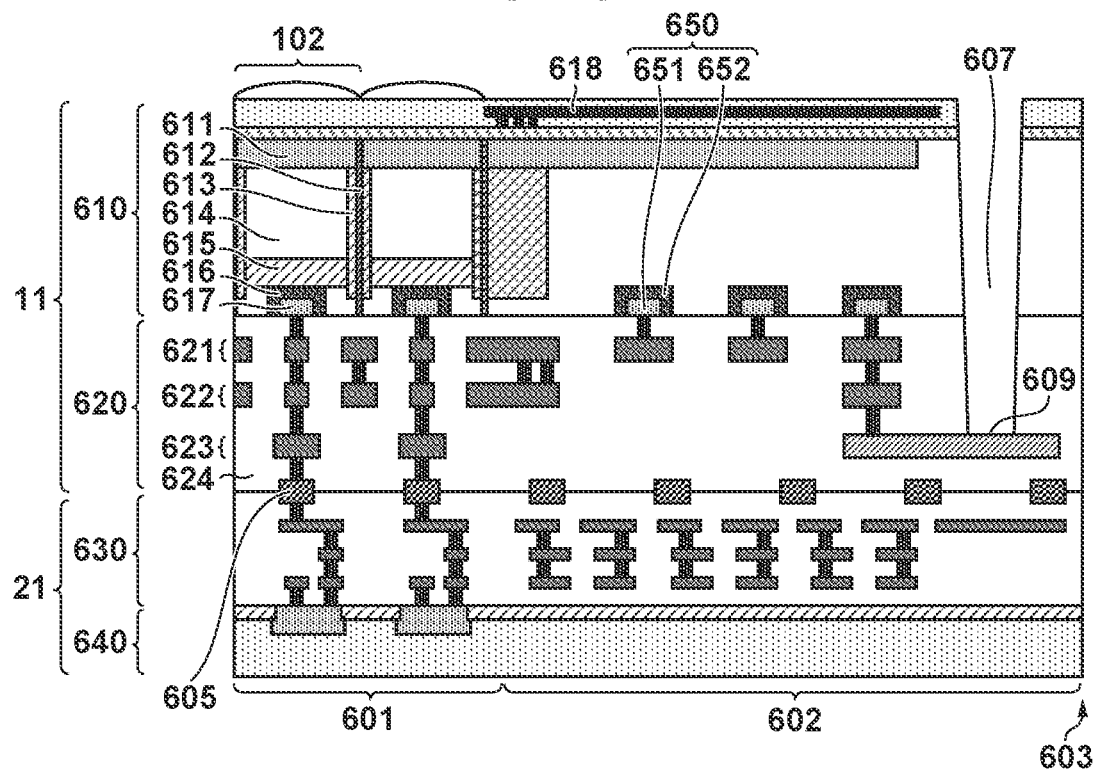
Figure 7A:
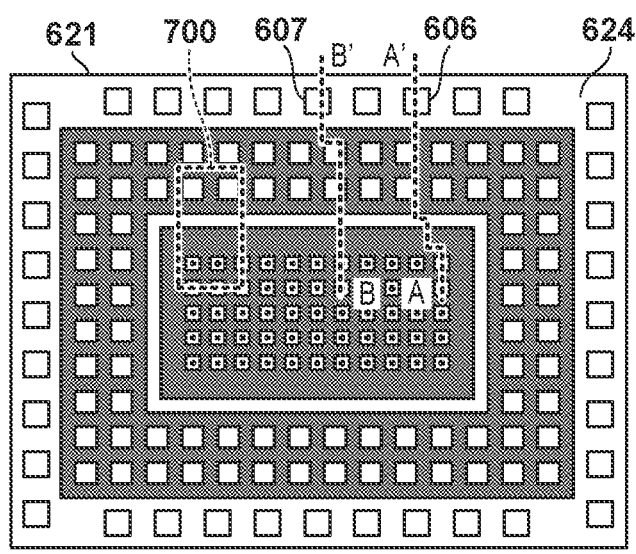
FIGS. 7A to 7F are plan views of the photoelectric conversion apparatus according to the first embodiment.
Figure 7B:
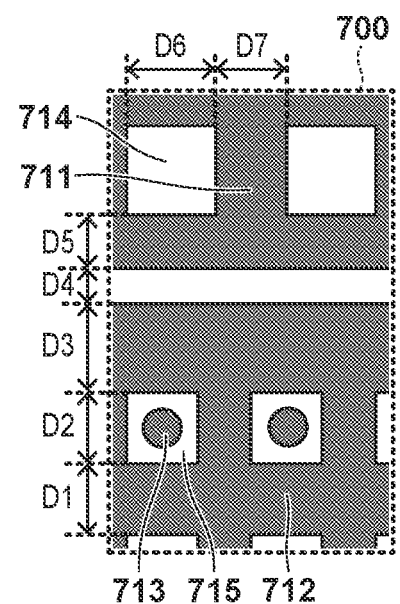
Figure 7C:
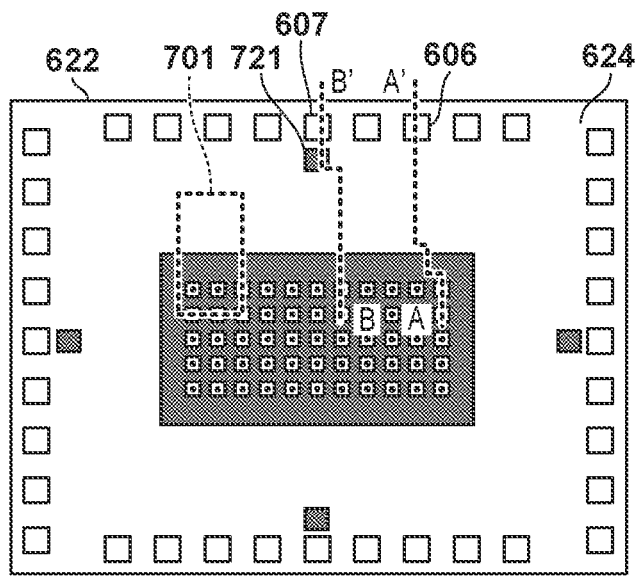
Figure 7D:
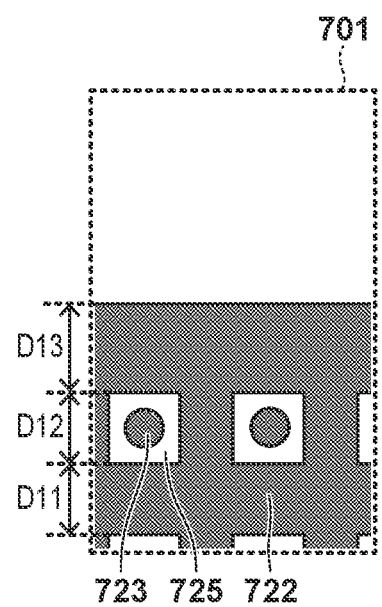
Figure 7E:
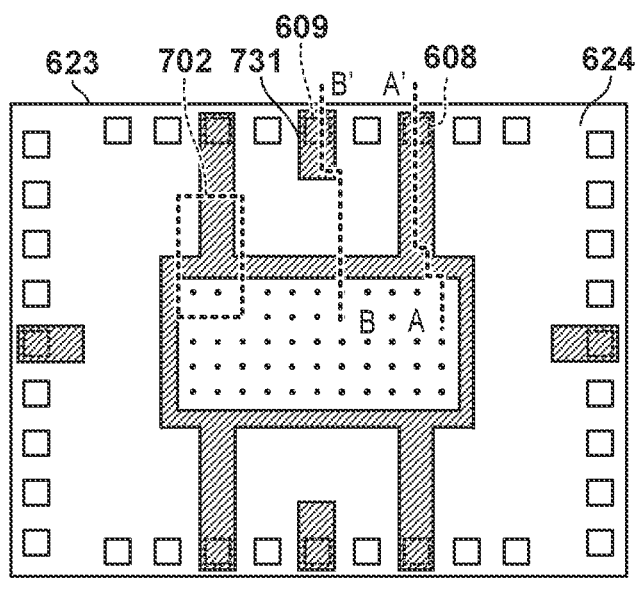
Figure 7F:
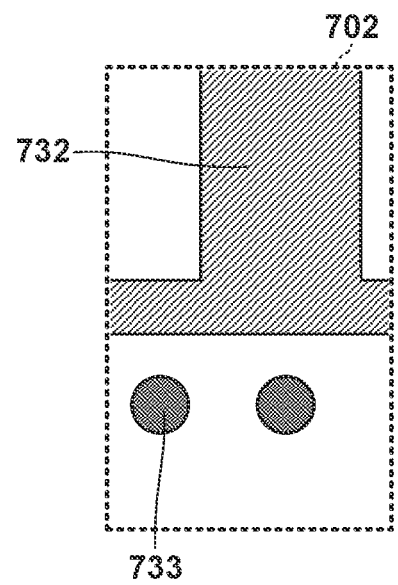
Figure 8A:
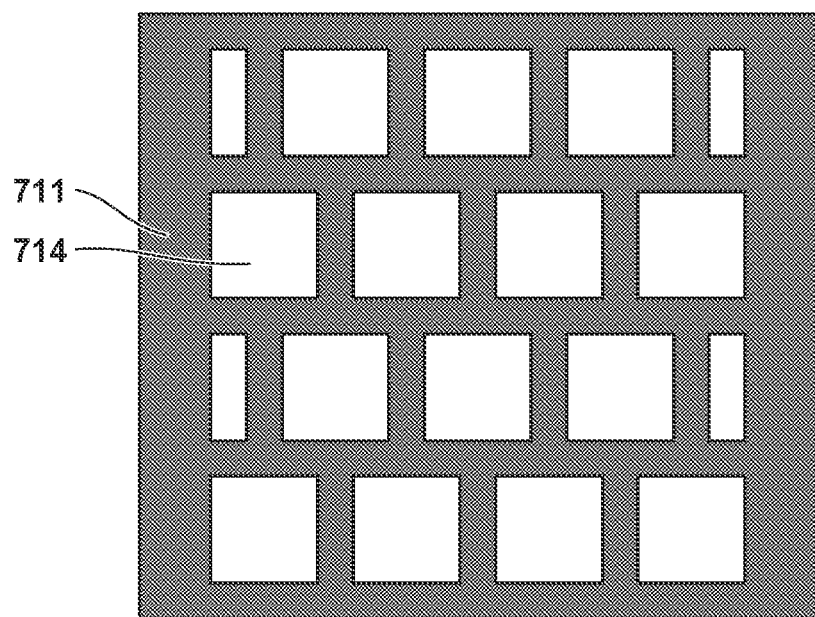
FIGS. 8A and 8B are schematic diagrams illustrating variations on a mesh shape according to the first embodiment.
Figure 8B:
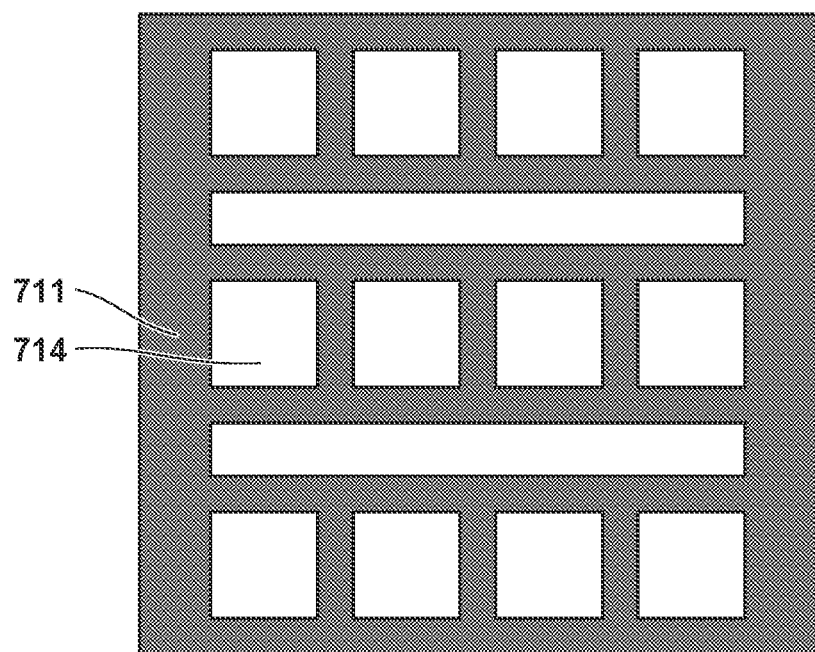
Figure 9A:
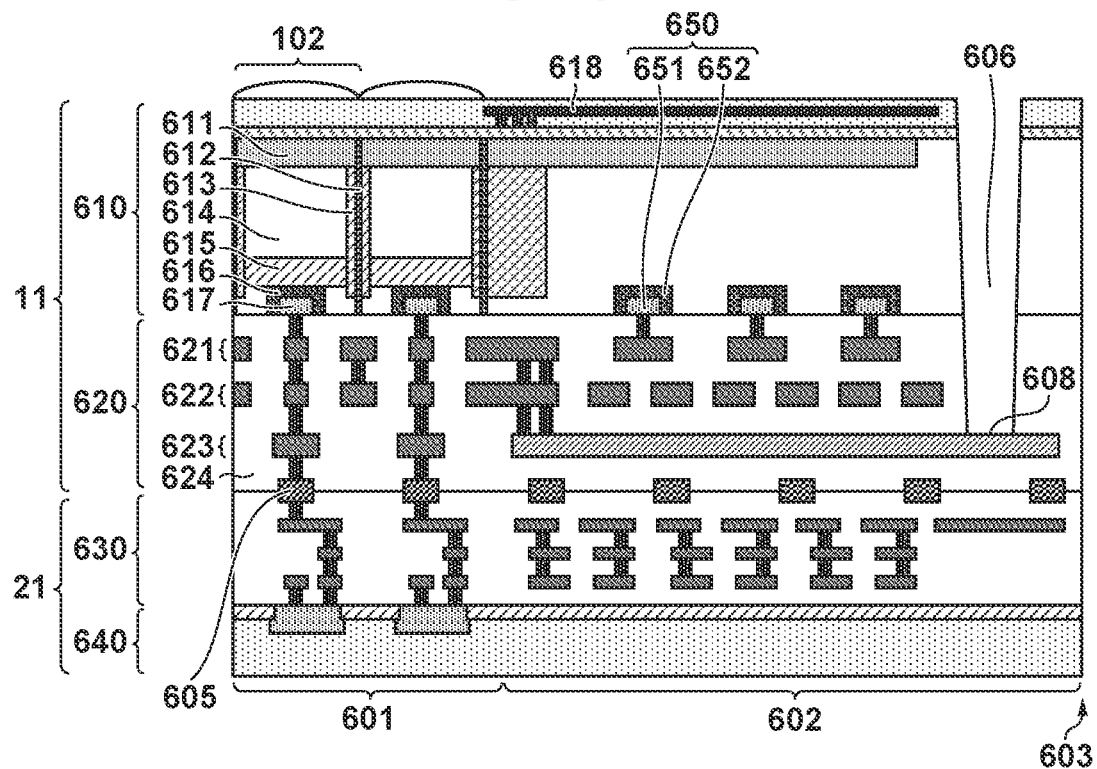
FIGS. 9A and 9B are cross-sectional views of a photoelectric conversion apparatus according to a second embodiment.
Figure 9B:
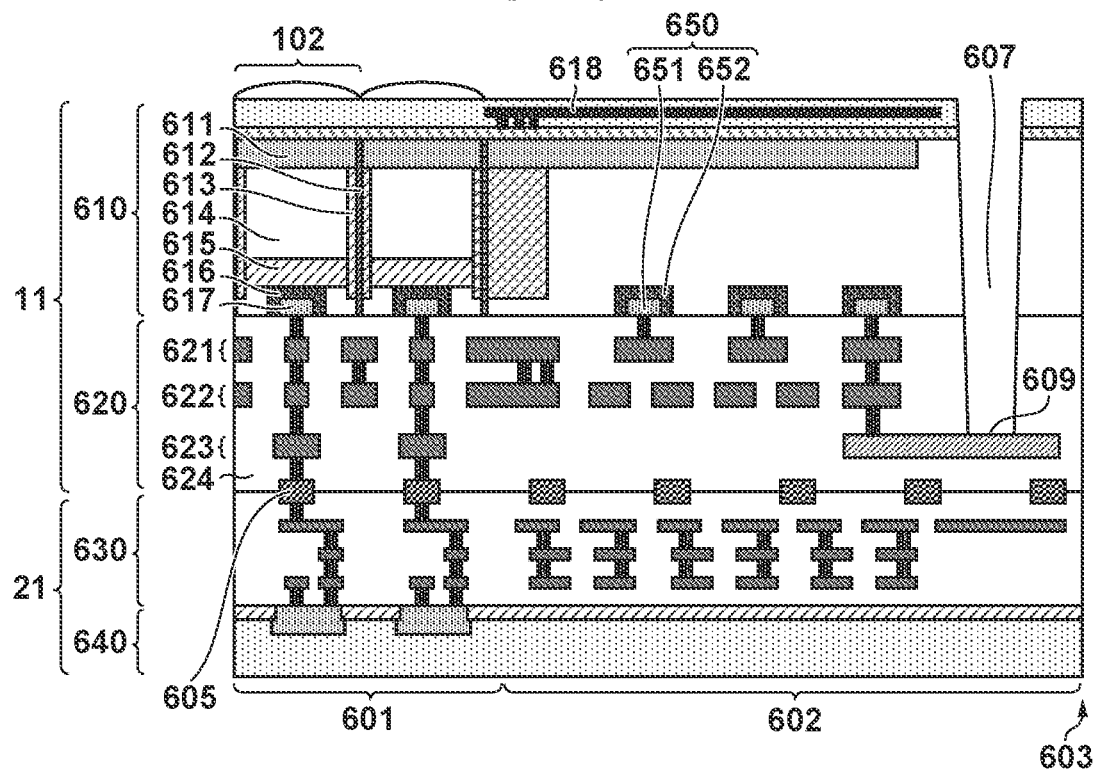

A specific example of the configuration of the photoelectric conversion apparatus 100 according to a first embodiment will be described with reference to FIGS. 6A to 8B. FIG. 6A is a cross-sectional view of the photoelectric conversion apparatus 100 at a line A-A' in FIGS. 7A, 7C, and 7E. FIG. 6B is a cross-sectional view of the photoelectric conversion apparatus 100 at a line B-B' in FIGS. 7A, 7C, and 7E. FIG. 7A is a plan view of a wiring layer 621. FIG. 7B is an enlarged view of a part 700 in FIG. 7A. FIG. 7C is a plan view of a wiring layer 622. FIG. 7D is an enlarged view of a part 701 in FIG. 7C. FIG. 7E is a plan view of a wiring layer 623. FIG. 7F is an enlarged view of a part 702 in FIG. 7E. FIGS. 8A and 8B illustrate variations on the shape of a conductive part 711.

The cross-sectional structure of the photoelectric conversion apparatus 100 will be described with reference to FIGS. 6A and 6B. As described above with reference to FIG. 1, the photoelectric conversion apparatus 100 includes the sensor substrate 11 and the circuit substrate 21. The sensor substrate 11 has a semiconductor layer 610 and a wiring structure 620. The wiring structure 620 is electrically connected to the semiconductor layer 610. The circuit substrate 21 has a semiconductor layer 640 and a wiring structure 630. The wiring structure 630 is electrically connected to the semiconductor layer 640. The wiring structure 620 and the wiring structure 630 are coupled to each other by a coupling part 605, and are electrically connected. The wiring structure 620 and the wiring structure 630 are located between the semiconductor layer 610 and the semiconductor layer 640. A bottom surface of the semiconductor layer 610 and a top surface of the wiring structure 620 are in contact with each other. Here, the "bottom surface of the semiconductor layer 610" refers to the surface located on the lower side in the cross-sectional views of FIGS. 6A and 6B. The use of the photoelectric conversion apparatus 100 is not intended to be limited to use in which this surface of the semiconductor layer 610 is on the lower side (in the direction of gravity). The same applies to the top surfaces and bottom surfaces described below. A bottom surface of the wiring structure 620 and a top surface of the wiring structure 630 are coupled to each other. A bottom surface of the wiring structure 630 and a top surface of the semiconductor layer 640 are in contact with each other. The photoelectric conversion apparatus 100 converts light incident from the top surface of the semiconductor layer 610 into an electrical signal.

In the following descriptions, a plan view relative to a boundary between the semiconductor layer 610 and the wiring structure 620 is denoted simply as a "plan view". If this boundary is a rough surface when viewed microscopically, the plan view is defined with respect to the boundary found when viewed macroscopically. When the top surface and the bottom surface of the semiconductor layer 610 are parallel, the plan view relative to the boundary between the semiconductor layer 610 and the wiring structure 620 is equivalent to the plan view of the top surface of the semiconductor layer 610 (i.e., a plane of incidence). In addition to this, the plan view relative to the bottom surface of the wiring structure 620, the top surface and the bottom surface of the wiring structure 630, and the top surface and bottom surface of the semiconductor layer 640, respectively, may be equivalent to the plan view relative to the boundary between the semiconductor layer 610 and the wiring structure 620.

Of the photoelectric conversion apparatus 100, a region in which, in plan view, the plurality of photoelectric conversion elements 102 are disposed, will be denoted as a pixel region 601. The pixel region 601 corresponds to the pixel region 12 in FIGS. 1 and 2. Of the photoelectric conversion apparatus 100, a region, in plan view, which is located between the pixel region 601 and an outer edge 603 of the photoelectric conversion apparatus 100, will be denoted as a peripheral region 602.

In the pixel region 601, the plurality of photoelectric conversion elements 102 are disposed in the semiconductor layer 610. Two adjacent photoelectric conversion elements 102 are separated by an element separation region 612 formed in the semiconductor layer 610. The photoelectric conversion element 102 and the peripheral region 602 are also separated by the element separation region 612. The element separation region 612 may have a Deep Trench Isolation (DTI) structure, for example. The DTI structure has a structure in which an insulator is provided in grooves formed in the semiconductor layer 610. The DTI structure may also be constituted by conductors, light-shielding members, or the like disposed in the grooves and insulators disposed between the conductors, light-shielding members, or the like and the grooves.

The photoelectric conversion element 102 is constituted by a plurality of impurity semiconductor regions formed in the semiconductor layer 610. Specifically, the photoelectric conversion element 102 is constituted by semiconductor regions 611 and 613 to 617. The semiconductor region 617 is flush with the bottom surface of the semiconductor layer 610. The semiconductor region 617 is of the N-type. The semiconductor region 616 surrounds the semiconductor region 617. The semiconductor region 616 is of the N-type. The concentration of the semiconductor region 617 may be higher than the concentration of the semiconductor region 616. The semiconductor region 615 is located above the semiconductor region 616. The semiconductor region 615 is of the P-type. The semiconductor region 614 is located above the semiconductor region 615. The semiconductor region 614 is of the N-type. The semiconductor region 611 is located above the semiconductor region 613. The semiconductor region 614 is of the P-type. The semiconductor region 613 surrounds the sides of the semiconductor regions 615 and 614. The semiconductor region 613 is of the P-type.

The cathode potential is supplied to the semiconductor region 617. The anode potential is supplied to the semiconductor region 613. The anode potential supplied to the semiconductor region 613 is also transmitted to the semiconductor regions 611 and 615. The area between the semiconductor region 615 and the semiconductor region 617 can also be called an "avalanche region" where avalanche multiplication occurs.

The semiconductor layer 610 has a charge discharge part 650 in the peripheral region 602. The charge discharge part 650 is constituted by semiconductor regions 651 and 652. The semiconductor region 651 is flush with the bottom surface of the semiconductor layer 610. The semiconductor region 651 is of the N-type. The semiconductor region 652 surrounds the semiconductor region 651. The semiconductor region 652 is of the N-type. The concentration of the semiconductor region 651 may be higher than the concentration of the semiconductor region 652. The semiconductor region 651 may have the same configuration (e.g., impurity concentration and size) as the semiconductor region 617. The semiconductor region 652 may have the same configuration (e.g., impurity concentration and size) as the semiconductor region 616. The P-type semiconductor region 611 formed in the pixel region 601 extends to the peripheral region 602 and overlaps with the charge discharge part 650 in plan view.

A predetermined potential is supplied to the semiconductor region 651. The potential supplied to the semiconductor region 651 may be equal to the cathode potential of the APD of the photoelectric conversion elements 102, or equal to a ground potential. Instead, a predetermined potential is supplied to the semiconductor region 651. The potential supplied to the semiconductor region 651 may be another potential falling within a range centered on the ground potential, with the cathode potential of the APD at one end of the range. For example, when the cathode potential of the APD is 1.1 V and the ground potential is 0 V, a potential in a range of no less than −1.1 V and no greater than 1.1 V may be supplied to the semiconductor region 651. By supplying such a potential, the charge discharge part 650 collects the charge (e.g., electrons) generated in the semiconductor layer 610 in the peripheral region 602 and discharges the charge to the exterior of the semiconductor layer 610. The semiconductor layer 610 further has a light-shielding layer 618. The light-shielding layer 618 overlaps the charge discharge part 650 in plan view.

The wiring structure 620 has a plurality of wiring layers in an interlayer insulation layer 624. In the example illustrated in FIGS. 6A and 6B, the wiring structure 620 has three wiring layers 621 to 623. Of the plurality of wiring layers included in the wiring structure 620, the wiring layer 621 is closest to the semiconductor layer 610, the wiring layer 622 is second-closest to the semiconductor layer 610, and the wiring layer 623 is third-closest to the semiconductor layer 610. In other words, the wiring structure 620 does not include other wiring layers between the wiring layer 621 and the semiconductor layer 610. Additionally, the wiring layer 622 is located between the wiring layer 621 and the wiring layer 623. The wiring layer 621 is located between the wiring layer 622 and the semiconductor layer 610.

Part of a conductive part included in the wiring layer 623 is exposed to the outside of the photoelectric conversion apparatus 100 through an opening 606. This exposed part serves as a pad 608. The pad 608 faces the outside of the photoelectric conversion apparatus 100. The pad 608 may be used to connect a wire. Part of the conductive part included in the wiring layer 623 is exposed to the outside of the photoelectric conversion apparatus 100 through an opening 607. This exposed part serves as a pad 609. The pad 609 faces the outside of the photoelectric conversion apparatus 100. The pad 609 may be used to connect a wire.

The wiring structure 620 and the wiring structure 630 are coupled to each other by a plurality of coupling parts 605. Configuration may be taken such that the coupling part 605 is coupled (joined) together with a coupling member generated on the sensor substrate 11 and a coupling member generated on the circuit substrate 21. The coupling part 605 may electrically connect the conductive part of the wiring structure 620 and the conductive part of the wiring structure 630 to each other. Some of the plurality of coupling parts 605 may not be used to electrically connect the conductive part of the wiring structure 620 and the conductive part of the wiring structure 630 to each other, and may rather be used to increase the coupling strength between the wiring structure 620 and the wiring structure 630.

Examples of the configurations of the wiring layers 621 to 623, respectively, will be described with reference to FIGS. 7A to 7F. An example of the configuration of the wiring layer 621 will be described with reference to FIGS. 7A and 7B. FIG. 7B is an enlarged view of the part 700 in FIG. 7A.

The wiring layer 621 has conductive parts 711 to 713 which have different roles from each other. The conductive part 711 is disposed in the peripheral region 602. The conductive part 711 is responsible for transmitting a potential supplied to the charge discharge part 650. The conductive part 711 is formed, for example, of a material which takes copper as its primary component. The conductive part 711 surrounds the pixel region 601 in plan view. Specifically, as illustrated in FIG. 7A, the conductive part 711 may surround the entire periphery of the pixel region 601 in plan view. The conductive part 711 includes a mesh-shaped part.

In the example illustrated in FIG. 7A, the entire conductive part 711 is mesh-shaped. In the mesh-shaped part, the openings are not limited to rectangles, and may be circles, other polygons, or the like. Alternatively, only some of the conductive part 711 may be mesh-shaped. In the example illustrated in FIG. 7A, the conductive part 711 is a single conductive member. Instead, however, the conductive part 711 may be divided into a plurality of conductive members.

The conductive part 712 is disposed in the pixel region 601. An outer part of the conductive part 712 crosses the boundary between the pixel region 601 and the peripheral region 602, and enters into the peripheral region 602. The conductive part 712 is responsible for transmitting the anode potential of the APD. The conductive part 712 is formed, for example, of a material which takes copper as its primary component. The conductive part 712 includes a mesh-shaped part. In the mesh-shaped part, the openings are not limited to rectangles, and may be circles, other polygons, or the like. In the example illustrated in FIG. 7A, an inner part of the conductive part 712 is mesh-shaped, and no openings are formed near the outer edge of the conductive part 712. Alternatively, the entirety of the conductive part 712 may be mesh-shaped. In the example illustrated in FIG. 7A, the conductive part 712 is a single conductive member. Instead, however, the conductive part 712 may be divided into a plurality of conductive members.

The conductive part 713 is disposed in the pixel region 601. The conductive part 713 is responsible for transmitting the cathode potential of the APD. The conductive part 713 is formed, for example, of a material which takes copper as its primary component. The wiring layer 621 has a plurality of conductive parts 713 corresponding to the plurality of photoelectric conversion elements 102. The plurality of photoelectric conversion elements 102 and the plurality of conductive parts 713 may correspond one-to-one. Each conductive part 713 is located within a corresponding opening 715 formed in the conductive part 712. In plan view, the outer edge of the conductive part 713 may be circular, quadrangular, pentagonal, or a polygon having even more sides (e.g., octagonal).

As described above, the conductive parts 711 to 713 have different roles from each other. Accordingly, the conductive parts 711 to 713 are electrically isolated from each other. The conductive parts 711 to 713 are also distanced from each other.

The sizes of the meshes in the conductive parts 711 and 712 will be described next. The mesh is constituted by a plurality of openings 714 formed with regularity in the conductive part 711. The width of the opening 714 is D6. If the opening 714 is square, the length of one side of the opening 714 is D6. When the opening 714 is rectangular, the average of the long side and the short side may be D6, or the long side or short side may be D6. When the opening 714 is a shape other than a rectangle, the average of the minimum distance and the maximum distance of a positive projection of the opening 714 may be D6, or this minimum distance or maximum distance may be D6. The same applies to the widths of the other openings described below. The distance between two adjacent openings 714 of the plurality of openings 714 is D7. In this case, D6+D7 represents the pitch of the mesh of the conductive part 711. The distance between the outer edge of the conductive part 711 and the plurality of openings 714 is denoted as D5.

The mesh is constituted by a plurality of openings 715 formed with regularity in the conductive part 712. The width of the opening 715 is D2. The distance between two adjacent openings 715 of the plurality of openings 715 is D1. In this case, D1+D2 represents the pitch of the mesh of the conductive part 712. The distance between the outer edge of the conductive part 712 and the plurality of openings 715 is denoted as D3. Furthermore, the distance between the conductive part 711 and the conductive part 712 is denoted as D4.

The pitch of the mesh of the conductive part 711 (i.e., D6+D7) may be greater than the pitch of the mesh of the conductive part 712 (i.e., D1+D2). In other words, the mesh of the conductive part 711 may be less fine than the mesh of the conductive part 712. The pitch of the mesh of the conductive part 712 may be the same as the pitch of the photoelectric conversion elements 102. D1 and D2 may be equal to each other. In other words, in the conductive part 712, the width of the mesh may be equal to the width of the openings. D6 may be greater than D7. In other words, in the conductive part 711, the width of the mesh may be smaller than the width of the openings. D3 may be greater than D2. In other words, in the conductive part 712, the width of the outer peripheral part may be greater than the width of the openings. Increasing the width of the outer peripheral part in this manner makes it possible to transmit the anode potential stably.

Examples of specific sizes will be given below. D1 may be 1 μm to 5 μm, for example. D2 may be 1 μm to 5 μm, for example. D3 may be 15 μm to 25 μm, for example. D4 may be 30 μm to 100 μm, for example. D5 may be 15 μm to 25 μm, for example. D6 may be 40 μm to 60 μm, for example. D7 may be 15 μm to 25 μm, for example.

An example of the configuration of the wiring layer 622 will be described next with reference to FIGS. 7C and 7D. FIG. 7D is an enlarged view of the part 701 in FIG. 7C. The wiring layer 622 has conductive parts 721 to 723 which have different roles from each other. The conductive part 721 is disposed in the peripheral region 602. The conductive part 721 is responsible for transmitting a potential supplied to the charge discharge part 650. The conductive part 721 is formed, for example, of a material which takes copper as its primary component. The wiring layer 622 has a total of four conductive parts 721, one at the center of each of the four sides of the photoelectric conversion apparatus 100. However, the number and location of the conductive parts 721 are not limited thereto.

The conductive part 722 is disposed in the pixel region 601. An outer part of the conductive part 722 crosses the boundary between the pixel region 601 and the peripheral region 602, and enters into the peripheral region 602. The conductive part 722 is responsible for transmitting the anode potential of the APD. The conductive part 722 is formed, for example, of a material which takes copper as its primary component. The conductive part 722 includes a mesh-shaped part. In the mesh-shaped part, the openings are not limited to rectangles, and may be circles, other polygons, or the like. Additionally, in the example illustrated in FIG. 7C, an inner part of the conductive part 722 is mesh-shaped, and no openings are formed near the outer edge of the conductive part 722. Alternatively, the entirety of the conductive part 722 may be mesh-shaped. In the example illustrated in FIG. 7C, the conductive part 722 is a single conductive member. Instead, however, the conductive part 722 may be divided into a plurality of conductive members.

The conductive part 723 is disposed in the pixel region 601. The conductive part 723 is responsible for transmitting the cathode potential of the APD. The conductive part 723 is formed, for example, of a material which takes copper as its primary component. The wiring layer 622 has a plurality of conductive parts 723 corresponding to the plurality of photoelectric conversion elements 102. The plurality of photoelectric conversion elements 102 and the plurality of conductive parts 723 may correspond one-to-one. Each conductive part 723 is located within a corresponding opening 725 formed in the conductive part 722. In plan view, the outer edge of the conductive part 723 may be circular, quadrangular, pentagonal, or a polygon having even more sides (e.g., octagonal).

As described above, the conductive parts 721 to 723 have different roles from each other. Accordingly, the conductive parts 721 to 723 are electrically isolated from each other. The conductive parts 721 to 723 are also distanced from each other.

The size of the mesh in the conductive part 722 will be described next. The mesh is constituted by a plurality of openings 725 formed with regularity in the conductive part 722. The width of the opening 725 is D12. The distance between two adjacent openings 725 of the plurality of openings 725 is D11. In this case, D11+D12 represents the pitch of the mesh of the conductive part 722. The distance between the outer edge of the conductive part 722 and the plurality of openings 725 is denoted as D13.

The pitch of the mesh of the conductive part 722 may be the same as the pitch of the photoelectric conversion elements 102. D11 and D12 may be equal to each other. In other words, in the conductive part 722, the width of the mesh may be equal to the width of the openings. D13 may be greater than D12. In other words, in the conductive part 722, the width of the outer peripheral part may be greater than the width of the openings.

The mesh of the conductive part 712 may be the same size as the mesh of the conductive part 722. In other words, the conditions D1=D11 and D2=D12 may hold true. In plan view, the openings 715 and the openings 725 may overlap perfectly (i.e., the outer edges of both may match). Furthermore, in plan view, the outer edges of the conductive part 712 may match the outer edges of the conductive part 722.

Examples of specific sizes will be given below. D11 may be 1 μm to 5 μm, for example. D12 may be 1 μm to 5 μm, for example. D13 may be 15 μm to 25 μm, for example.

An example of the configuration of the wiring layer 623 will be described next with reference to FIGS. 7E and 7F. FIG. 7F is an enlarged view of the part 702 in FIG. 7E. The wiring layer 623 has conductive parts 731 to 733 which have different roles from each other. The conductive part 731 is disposed in the peripheral region 602. The conductive part 731 is responsible for transmitting a potential supplied to the charge discharge part 650. The conductive part 731 includes the pad 609, which faces the outside of the photoelectric conversion element 102. The conductive part 731 is formed of aluminum, for example. The wiring layer 623 has a total of four conductive parts 731, one at the center of each of the four sides of the photoelectric conversion element 102. However, the number and location of the conductive parts 731 are not limited thereto.

The conductive part 732 is disposed in the pixel region 601 and the peripheral region 602. The conductive part 732 is responsible for transmitting the anode potential of the APD. The conductive part 732 is formed of aluminum, for example. The conductive part 732 has a circular shape in the pixel region 601, and part thereof extends to the vicinity of the outer edge 603 of the photoelectric conversion element 102. The conductive part 731 includes the pad 608, which faces the outside of the photoelectric conversion element 102. In the example illustrated in FIG. 7E, the conductive part 732 is a single conductive member. Instead, however, the conductive part 732 may be divided into a plurality of conductive members.

The conductive part 733 is disposed in the pixel region 601. The conductive part 733 is responsible for transmitting the cathode potential of the APD. The cathode potential is supplied through the wiring layer located below the wiring structure 620, the wiring layer of the wiring structure 630, and the like. The conductive part 733 is formed, for example, of a material which takes copper as its primary component. The wiring layer 623 has a plurality of conductive parts 733 corresponding to the plurality of photoelectric conversion elements 102. The plurality of photoelectric conversion elements 102 and the plurality of conductive parts 733 may correspond one-to-one. Each conductive part 733 is located within a corresponding opening formed in the conductive part 732. In plan view, the outer edge of the conductive part 733 may be circular, quadrangular, pentagonal, or a polygon having even more sides (e.g., octagonal). In plan view, the conductive part 733 may be larger than the conductive part 713, and may be larger than the conductive part 723.

As described above, the conductive parts 731 to 733 have different roles from each other. Accordingly, the conductive parts 731 to 733 are electrically isolated from each other. The conductive parts 731 to 733 are also distanced from each other.

The connection relationships between the wiring layers 621 to 623, the semiconductor layer 610, and the coupling parts 605 will be described next. The conductive parts 711, 721, and 731 are all responsible for transmitting a potential supplied to the charge discharge part 650. The conductive parts 711, 721, and 731 are electrically connected to each other. Specifically, the conductive part 711 and the conductive part 721 overlap in plan view, and are connected to each other by a plug near the pad 609. In the present specification, the term "overlap" can include both a partial overlap and a perfect overlap. The conductive part 721 and the conductive part 731 overlap in plan view, and are connected to each other by a plug near the pad 609. The conductive part 711 is connected to each of the plurality of charge discharge parts 650 (specifically, the semiconductor regions 651 thereof) by plugs.

When the photoelectric conversion apparatus 100 is in use, a predetermined potential is supplied to the pad 609 from outside the photoelectric conversion element 102. This potential is transmitted by the conductive parts 711, 721, and 731 and supplied to the semiconductor region 651. As described above, this potential may be a potential falling within a range centered on the ground potential, with the cathode potential of the APD at one end of the range.

The conductive parts 712, 722, and 732 are all responsible for transmitting the anode potential of the APD. The conductive parts 712, 722, and 732 are electrically connected to each other. Specifically, the conductive part 712 and the conductive part 722 overlap in plan view and are connected to each other by plugs near the boundary between the pixel region 601 and the peripheral region 602, and at a plurality of locations within the pixel region 601. The conductive part 722 and the conductive part 732 overlap in plan view and are connected to each other by plugs near the boundary between the pixel region 601 and the peripheral region 602. The conductive part 712 is connected to the semiconductor layer 610 (specifically, the vicinity of the semiconductor region 613) by plugs at a plurality of locations within the pixel region.

When the photoelectric conversion apparatus 100 is in use, the anode potential is supplied to the pad 608 from outside the photoelectric conversion element 102. The anode potential is transmitted by the conductive parts 712, 722, and 732 and supplied to the semiconductor layer 610.

The conductive parts 713, 723, and 733 are all responsible for transmitting the cathode potential of the APD. The conductive parts 713, 723, and 733 disposed for the same photoelectric conversion element 102 are electrically connected to each other. Specifically, the conductive part 713 and the conductive part 723 overlap in plan view, and are connected to each other by a plug. The conductive part 723 and the conductive part 733 overlap in plan view, and are connected to each other by a plug. The conductive part 733 and one of the coupling parts 605 overlap in plan view, and are connected to each other by a plug. The conductive part 713 is connected to the semiconductor layer 610 (specifically, the semiconductor region 617) by a plug.

When the photoelectric conversion apparatus 100 is in use, the cathode potential is supplied from the circuit substrate 21 to the sensor substrate 11. The cathode potential is transmitted by the conductive parts 713, 723, and 733 and supplied to the semiconductor region 617 of the semiconductor layer 610.

The overlap relationships between the conductive parts which have different roles from each other will be described next. The overlap relationships described below are all overlap relationships with respect to plan views.

None of the conductive parts 712, 713, 721, 722, 723, 731 and 733 overlap with conductive parts which are included in the wiring layers 621 to 623 and have different roles from themselves. The conductive part 711 and the conductive part 732 overlap each other in the peripheral region 602.

Technical effects of the present embodiment will be described next. As described above, the conductive part 711 and the conductive part 732 overlap each other in the peripheral region 602. The conductive part 711 is used to transmit a predetermined potential, and the conductive part 732 is used to transmit the anode potential. The predetermined potential transmitted by the conductive part 711 is, for example, another potential falling within a range centered on the ground potential, with the cathode potential of the APD at one end of the range. The cathode potential is, for example, 1 V, 1.1 V, or the like. On the other hand, the cathode potential can fall within the range of −20 V to −35 V, or be a potential around that range, for example. Accordingly, the potential difference between the anode potential and the predetermined potential can be a value in a range such as no less than 15 V and no greater than 50 V.

As such, in the present embodiment, the breakdown voltage performance at the position where the conductive part 711 and the conductive part 732 overlap each other is improved. Specifically, the wiring layer 621 including the conductive part 711 and the wiring layer 623 including the conductive part 732 are not adjacent to each other, and the wiring layer 623 is located therebetween. The wiring layer 622 does not include conductive parts at the positions where the conductive part 711 and the conductive part 732 overlap. Thus, by moving the conductive part 711 and the conductive part 732 away from each other in this manner, the impact of applying high voltages can be reduced.

Technical effects of the present embodiment will be described. Heat produced in the circuit substrate 21 is transmitted toward the semiconductor layer 610 through the wiring structure 620 and the wiring structure 630. The mesh-shaped conductive part 711 formed in the peripheral region 602 is connected to the pad 609 through other conductive parts and plugs. These conductive parts and plugs are formed of metal and therefore have a higher thermal conductivity than the interlayer insulation layer 624. Accordingly, heat can be dissipated from the semiconductor layer 610 to the outside of the photoelectric conversion apparatus 100. The wiring structure 620 uses fewer wires than the wiring structure 630. Accordingly, the surface area of the conductive part 711 can be increased by forming the conductive part 711 in the wiring structure 620. This further improves the heat dissipation performance. Furthermore, by including the mesh-shaped part in the conductive part 711, a difference in the density of the conductive part in the wiring layer 621, between the pixel region 601 and the peripheral region 602, can be reduced. This reduction in the density difference is advantageous during planarization performed when manufacturing the wiring layer 621.

Variations on the present embodiment will be described next. Although the wiring structure 620 includes three wiring layers in the examples illustrated in FIGS. 6A and 6B, the number of wiring layers is not limited thereto. When the wiring structure 620 includes at least four wiring layers, at least two of the wiring layers may be located between the wiring layer including the conductive part 711 and the wiring layer including the conductive part 732.

In the example described above, the wiring layer 621 includes the conductive part 711. Alternatively, the wiring layer 622 may include the conductive part 711. The effect of improving the heat dissipation performance can be achieved in this case as well.

In the example described above, a predetermined potential is supplied to the charge discharge part 650 through the wiring layer 621, and the anode potential is supplied to the photoelectric conversion element 102 through the wiring layer 623. Instead, a predetermined potential may be supplied to the charge discharge part 650 through the wiring layer 623, and the anode potential may be supplied to the photoelectric conversion element 102 through the wiring layer 621.

In the example described above, the conductive part 711 has a lattice-shaped mesh. Instead, the mesh may have another shape. Variations on the shape of the mesh will be described with reference to FIGS. 8A and 8B. In the example illustrated in FIG. 8A, the openings 714 are arranged so as to be offset from row to row. In the example illustrated in FIG. 8B, the openings 714 have a plurality of different sizes. Regardless of the shape, the conductive part 711 can be mesh-shaped as long as the plurality of openings 714 are provided. The other conductive parts 712 and 722 aside from the conductive part 711 may also have meshes of the shapes illustrated in FIGS. 8A and 8B, or other shapes.

Second Embodiment

Figure 10A:
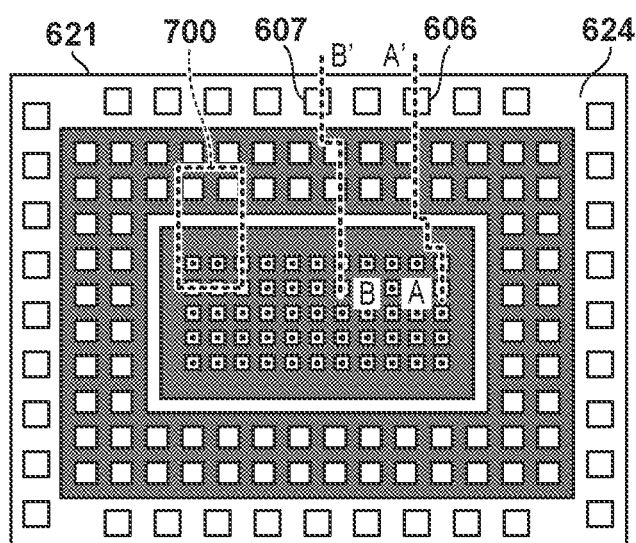
FIGS. 10A to 10F are plan views of the photoelectric conversion apparatus according to the second embodiment.
Figure 10B:
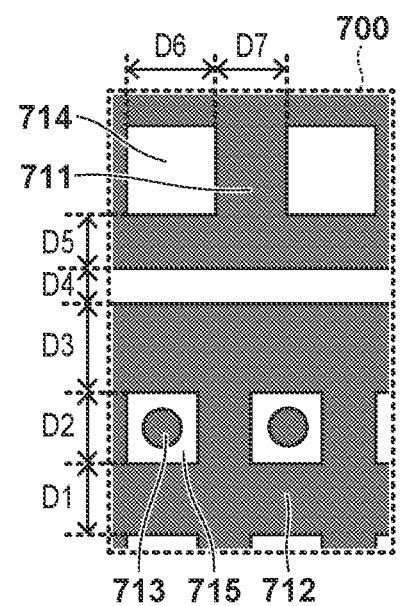
Figure 10C:
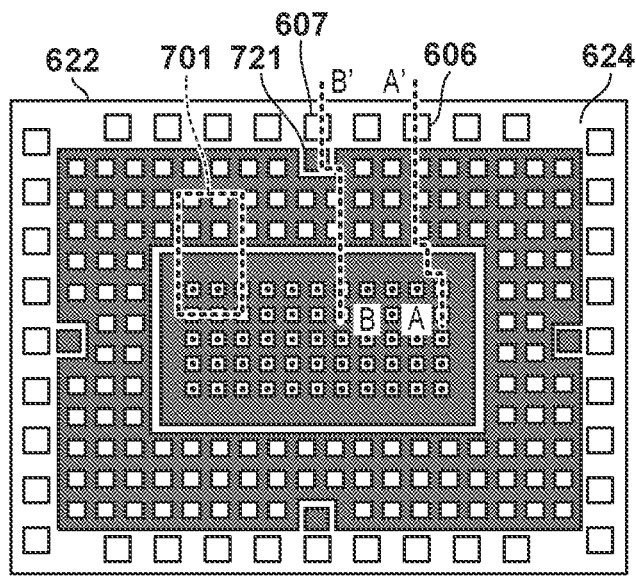
Figure 10D:
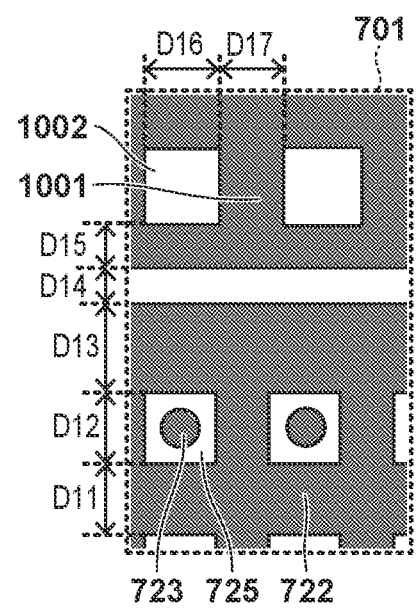
Figure 10E:
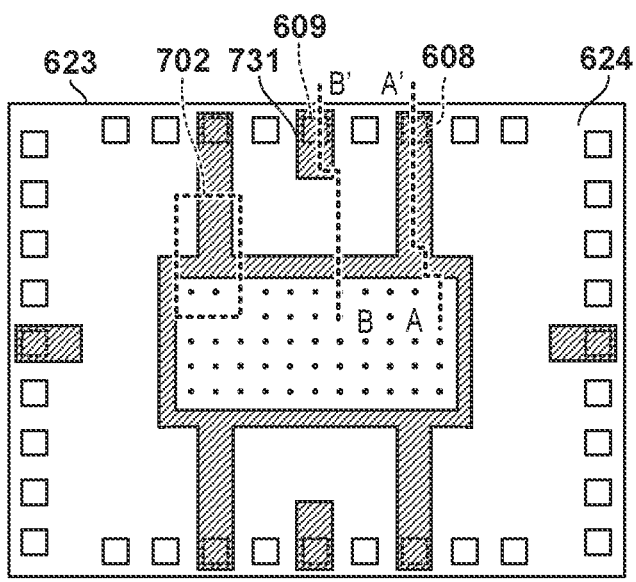
Figure 10F:
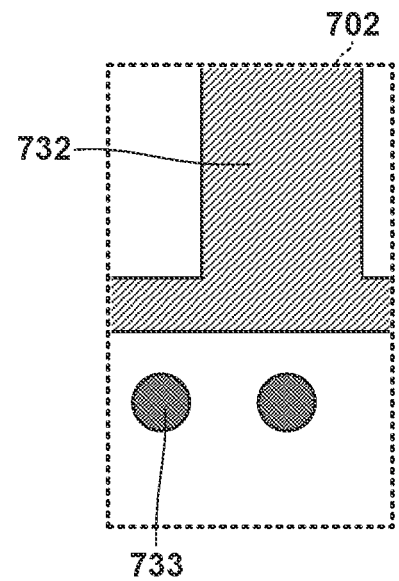
Figure 11A:
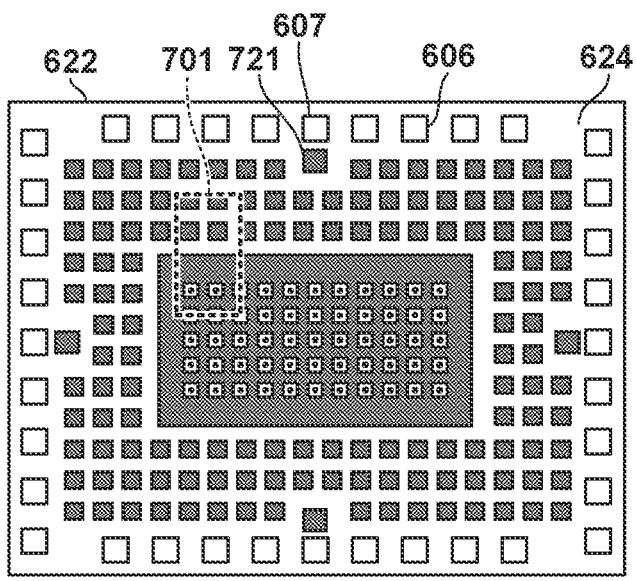
FIGS. 11A and 11B are schematic diagrams illustrating a variation on a conductive part according to the second embodiment.
Figure 11B:
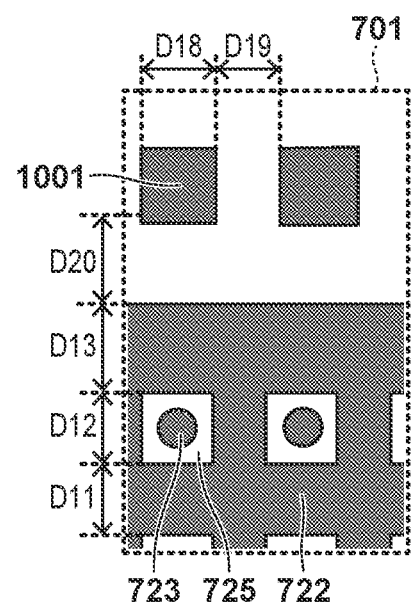

A specific example of the configuration of the photoelectric conversion apparatus 100 according to a second embodiment will be described with reference to FIGS. 9A to 11B. The following descriptions will focus on the differences from the first embodiment. Parts not described here may be similar to those in the first embodiment. FIGS. 9A to 10F correspond to FIGS. 6A to 7F, respectively, from the first embodiment. FIGS. 11A and 11B illustrate variations on the shape of a conductive part 1001.

The second embodiment differs from the first embodiment in that the wiring layer 622 further includes the conductive part 1001. The conductive part 1001 is disposed in the peripheral region 602. The conductive part 1001 is formed, for example, of a material which takes copper as its primary component. The conductive part 1001 surrounds the pixel region 601 in plan view. Specifically, as illustrated in FIG. 10A, the conductive part 1001 may surround the entire periphery of the pixel region 601 in plan view. The conductive part 1001 includes a mesh-shaped part. In the example illustrated in FIG. 10A, the entire conductive part 1001 is mesh-shaped. Alternatively, only some of the conductive part 1001 may be mesh-shaped. In the example illustrated in FIG. 10A, the conductive part 1001 is a single conductive member. Instead, however, the conductive part 1001 may be divided into a plurality of conductive members.

The size of the mesh in the conductive part 1001 will be described. The mesh is constituted by a plurality of openings 1002 formed with regularity in the conductive part 1001. The width of each opening 1002 is D16. The distance between two adjacent openings 1002 of the plurality of openings 1002 is D17. In this case, D16+D17 represents the pitch of the mesh of the conductive part 1001. The distance between the outer edge of the conductive part 1001 and the plurality of openings 1002 is denoted as D15. The distance between the conductive part 1001 and the conductive part 722 is denoted as D14.

The pitch of the mesh of the conductive part 1001 (i.e., D16+D17) may be greater than the pitch of the mesh of the conductive part 722 (i.e., D11+D12). In other words, the mesh of the conductive part 1001 may be less fine than the mesh of the conductive part 722. Furthermore, the pitch of the mesh of the conductive part 1001 (i.e., D16+D17) may be smaller than the pitch of the mesh of the conductive part 711 (i.e., D6+D7). In other words, the mesh of the conductive part 1001 may be finer than the mesh of the conductive part 711. D16 may be greater than D17. In other words, in the conductive part 712, the width of the mesh may be smaller than the width of the openings. D13 may be greater than D12. In other words, in the conductive part 712, the width of the outer peripheral part may be greater than the width of the openings. Increasing the width of the outer peripheral part in this manner makes it possible to transmit the anode potential stably.

Examples of specific sizes will be given below. D14 may be 20 μm to 80 μm, for example. D15 may be 15 μm to 25 μm, for example. D16 may be 30 μm to 50 μm, for example. D17 may be 10 μm to 20 μm, for example.

The conductive part 1001 overlaps with the conductive part 711 and the conductive part 732 in plan view. By providing the conductive part 1001 in the wiring layer 622, a difference in the density of the conductive part in the wiring layer 622, between the pixel region 601 and the peripheral region 602, can be reduced. This reduction in the density difference is advantageous during planarization performed when manufacturing the wiring layer 622.

The conductive part 1001 does not have to be used to transmit signals and supply power. For example, the conductive part 1001 need not be electrically connected to other conductive parts of the photoelectric conversion apparatus 100. In this case, when the photoelectric conversion apparatus 100 is in use, no potential is supplied to the conductive part 1001, and the conductive part 1001 is in a floating state. Instead, a predetermined potential may be supplied to the conductive part 1001. To achieve the effect of improving the breakdown voltage performance of the photoelectric conversion apparatus 100, the potential supplied to the conductive part 1001 may have a value close to the average value of the potential transmitted by the conductive part 711 and the anode potential. Specifically, the potential supplied to the conductive part 1001 may fall within a range which is centered on the average value of the anode potential and the potential transmitted by the conductive part 711 and which has a width of half the difference between the anode potential and the potential transmitted by the conductive part 711. Specifically, when the anode potential is set to −20 V and the potential transmitted by the conductive part 711 is set to 1 V, the potential supplied to the conductive part 1001 may be in a range of no less than −15.75 V and no greater than −5.25 V.

Variations on the conductive part 1001 will be described with reference to FIGS. 11A and 11B. FIG. 11A is a plan view of the wiring layer 622. FIG. 11B is an enlarged view of the part 701 in FIG. 11A. In this example, the wiring layer 622 has a plurality of the conductive parts 1001 dispersed in island-like shapes. The plurality of conductive parts 1001 are located in the peripheral region 602. The plurality of conductive parts 1001 are located on the four sides of the pixel region 601.

The width of one of the conductive parts 1001 is denoted as D18. The distance between two adjacent conductive parts 1001 is denoted as D19. The distance between the conductive part 1001 and the conductive part 722 is denoted as D20. D18 may be 10 μm to 50 μm, for example. D19 may be 10 μm to 50 μm, for example. D20 may be 15 μm to 25 μm, for example.

Third Embodiment

Figure 12:
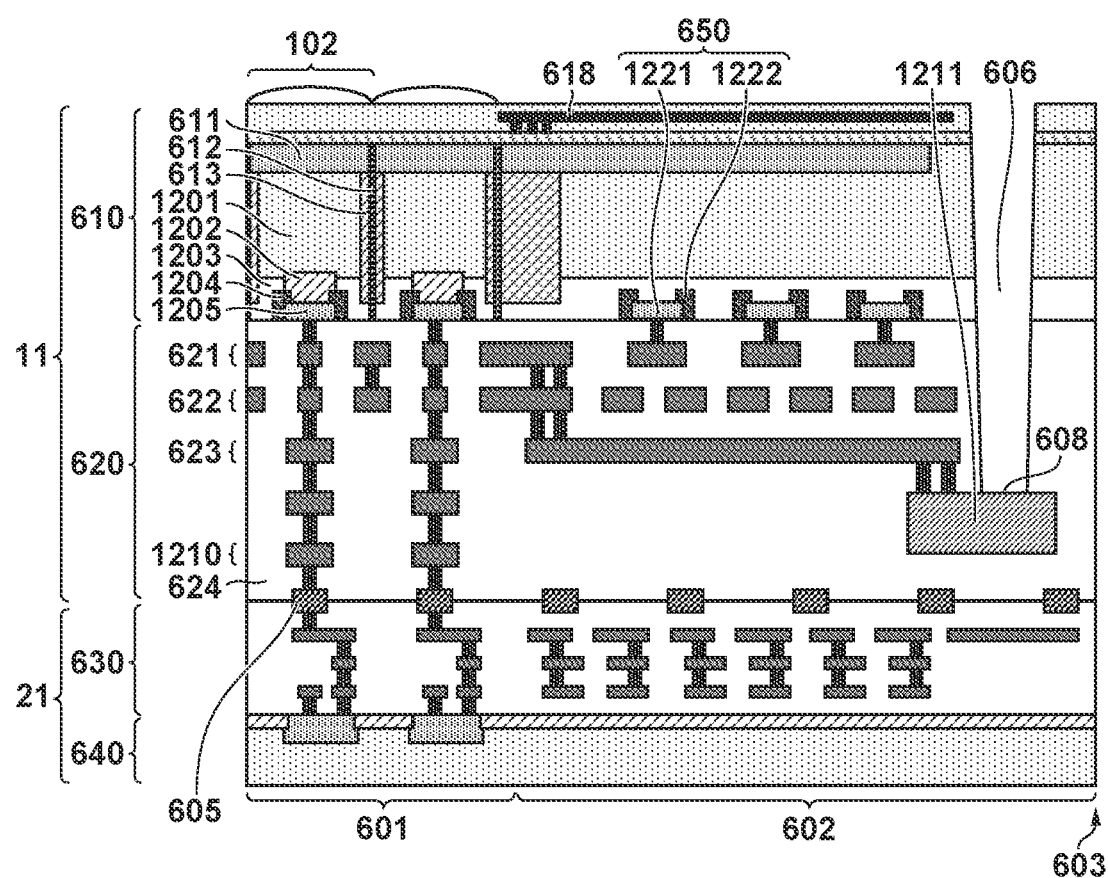
FIG. 12 is a cross-sectional view of a photoelectric conversion apparatus according to a third embodiment.
Figure 13A:
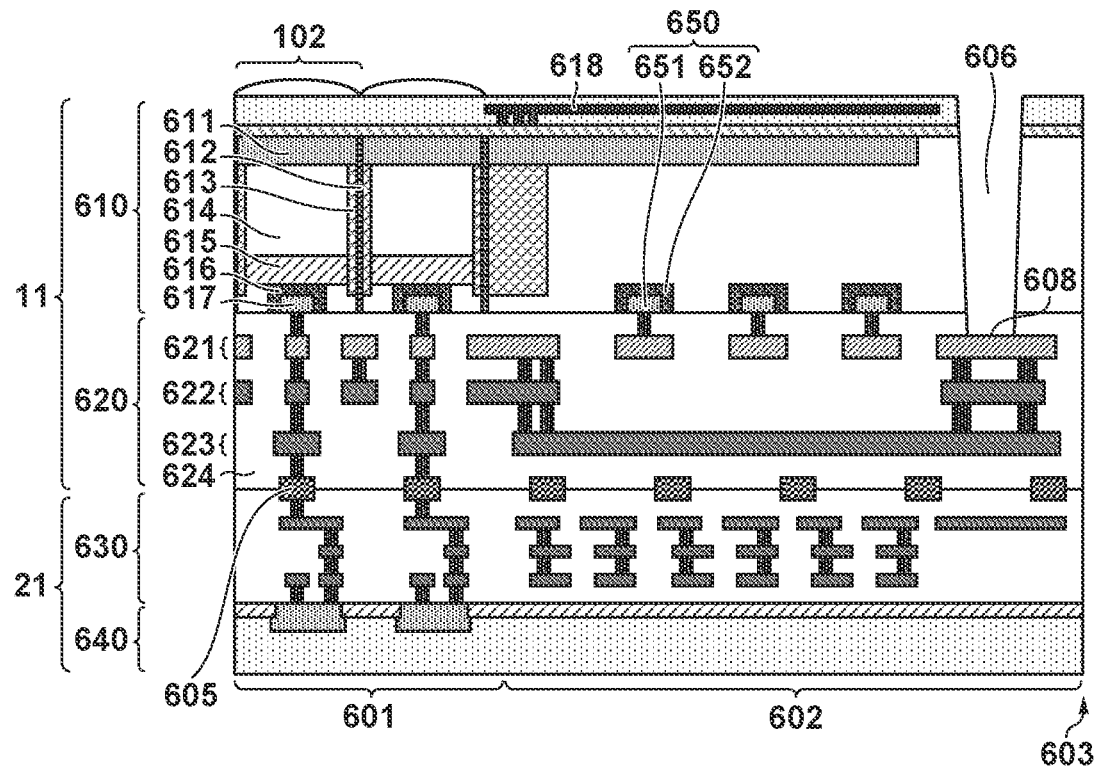
FIGS. 13A and 13B are cross-sectional views of a photoelectric conversion apparatus according to a fourth embodiment.
Figure 13B:
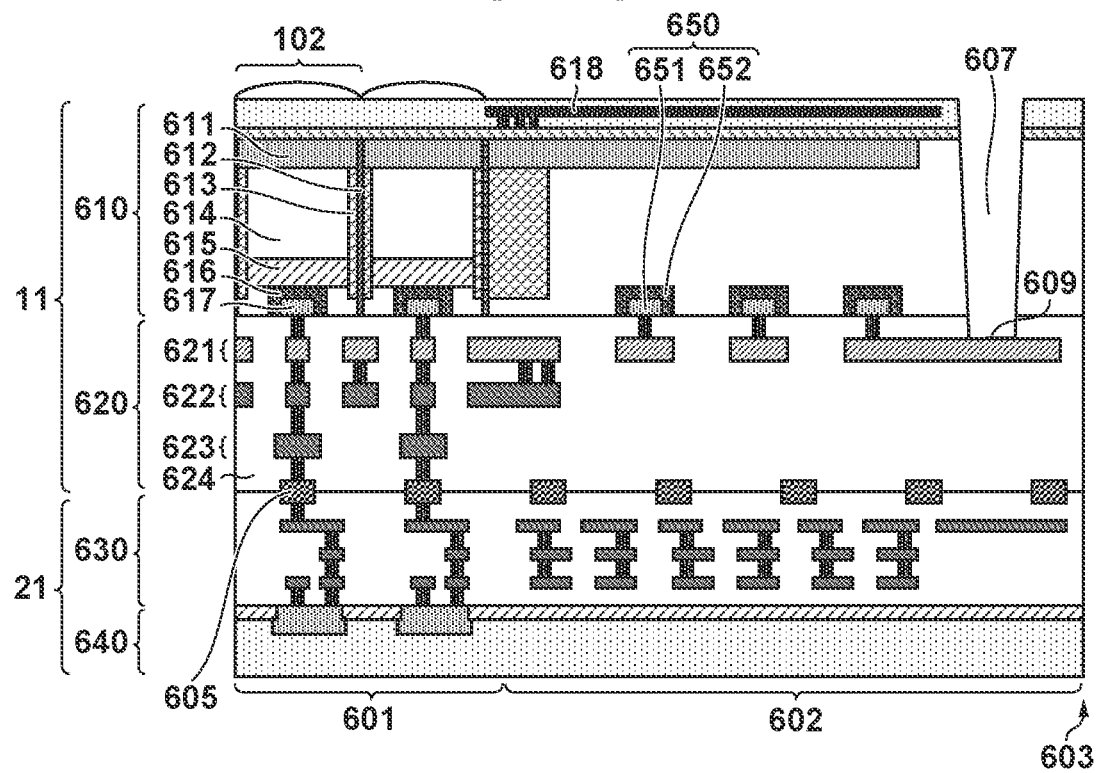
Figure 14A:
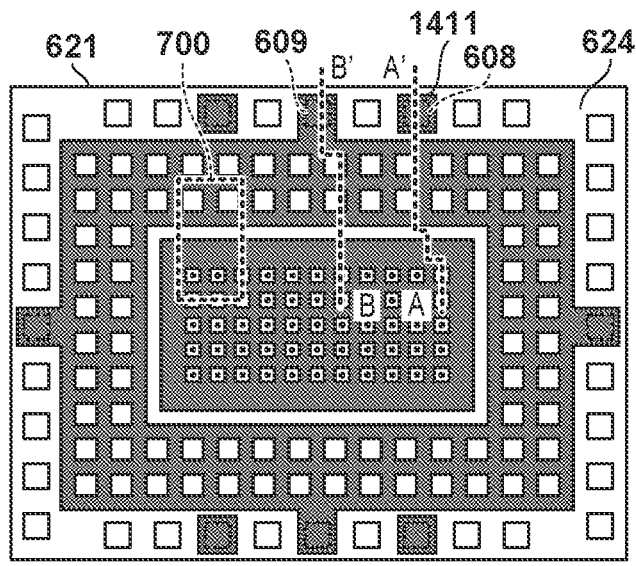
FIGS. 14A to 14F are plan views of a photoelectric conversion apparatus according to a fifth embodiment.
Figure 14B:
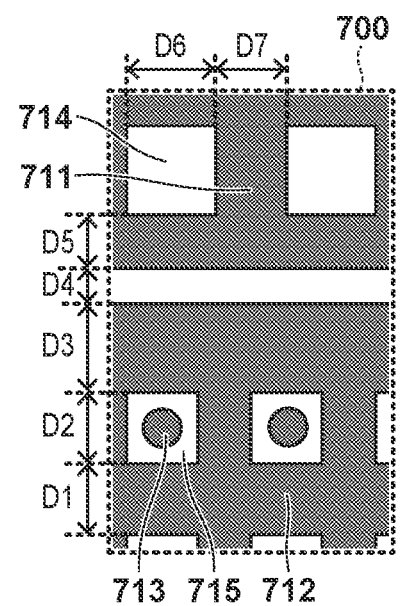
Figure 14C:
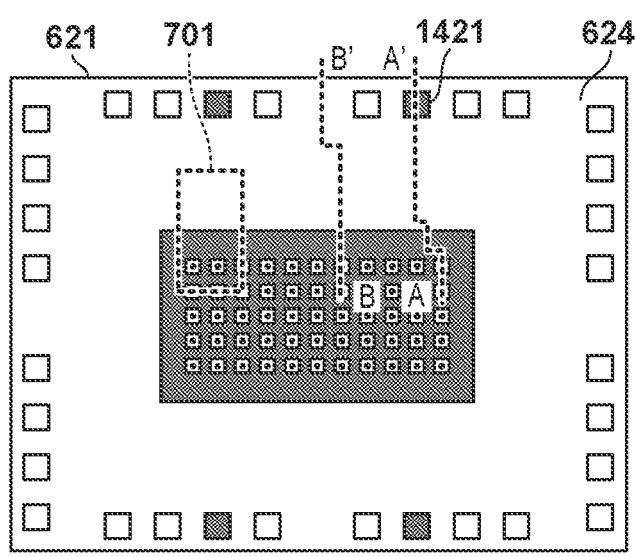
Figure 14D:
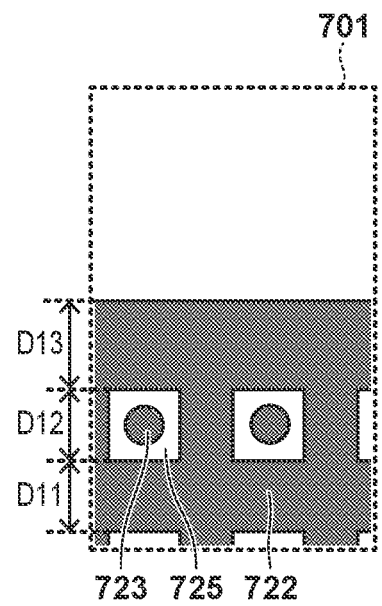
Figure 14E:
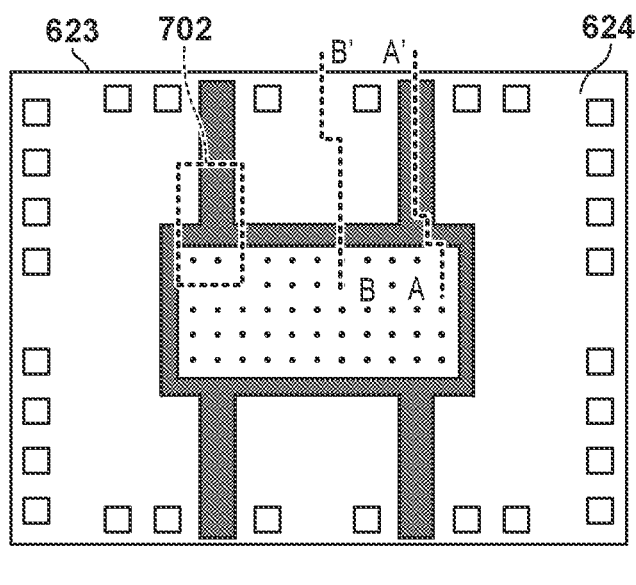
Figure 14F:
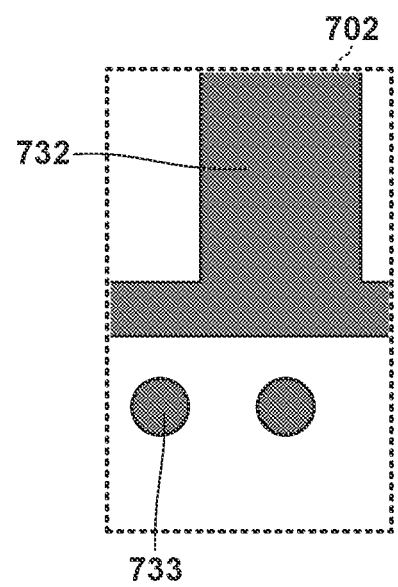
Figure 15A:
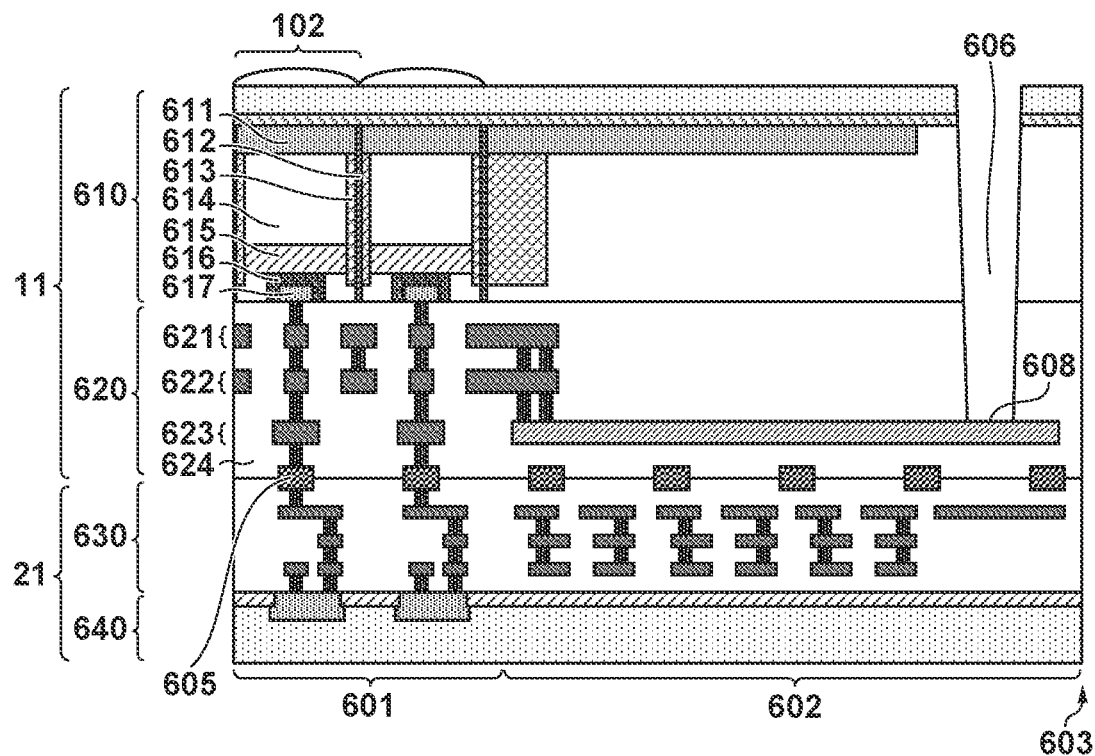
FIGS. 15A and 15B are cross-sectional views of a photoelectric conversion apparatus according to a reference example.
Figure 15B:
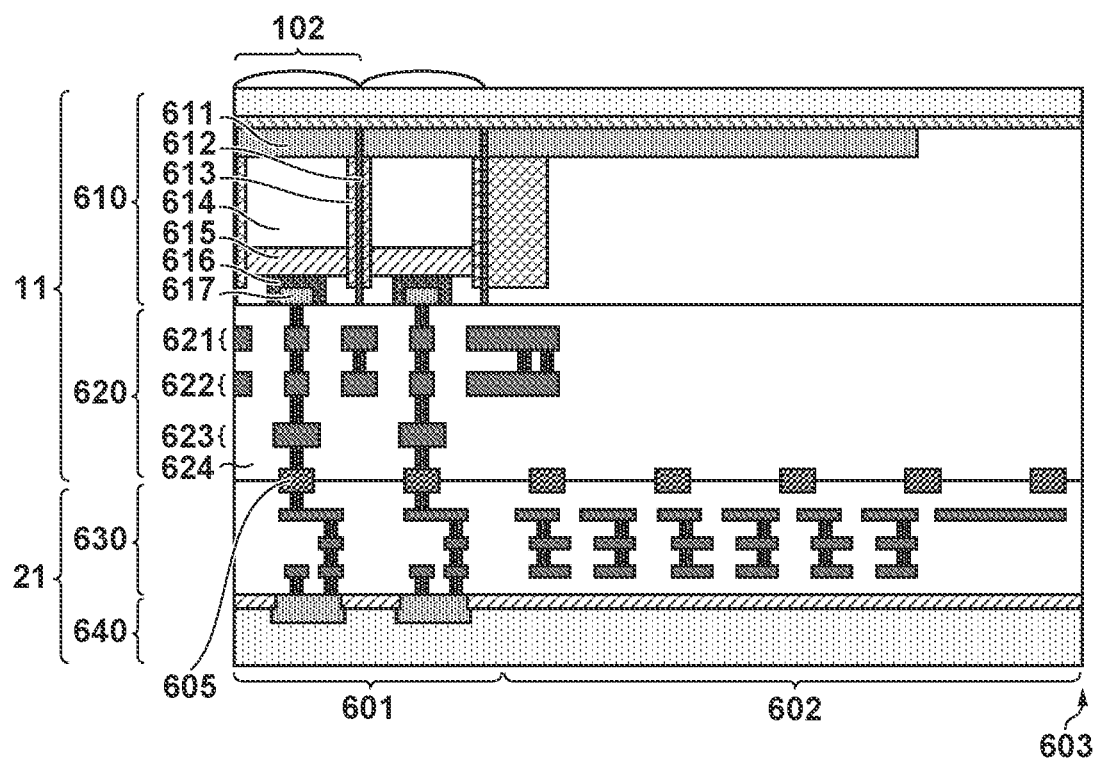
Figure 16A:
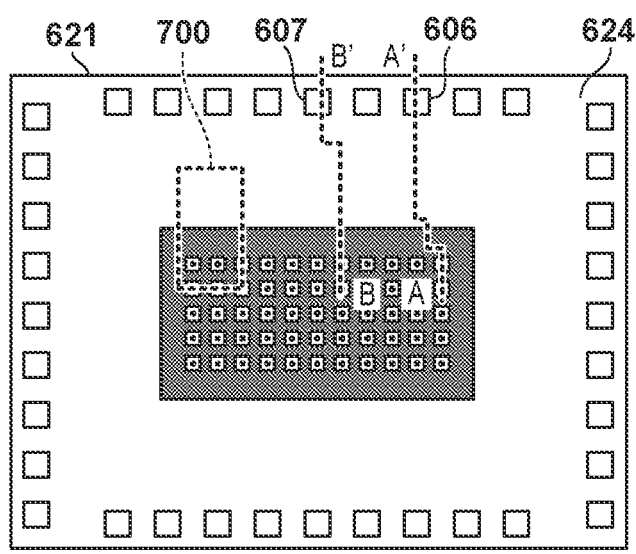
FIGS. 16A to 16F are plan views of the photoelectric conversion apparatus according to the reference example.
Figure 16B:
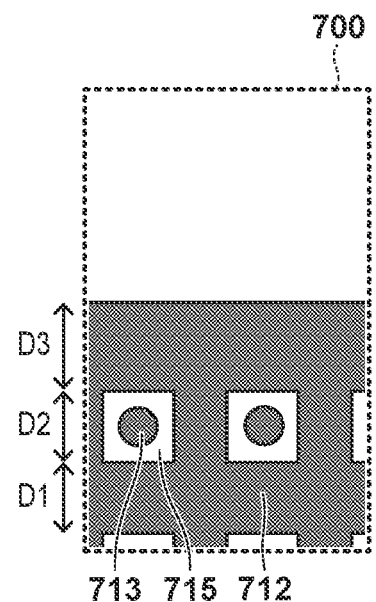
Figure 16C:
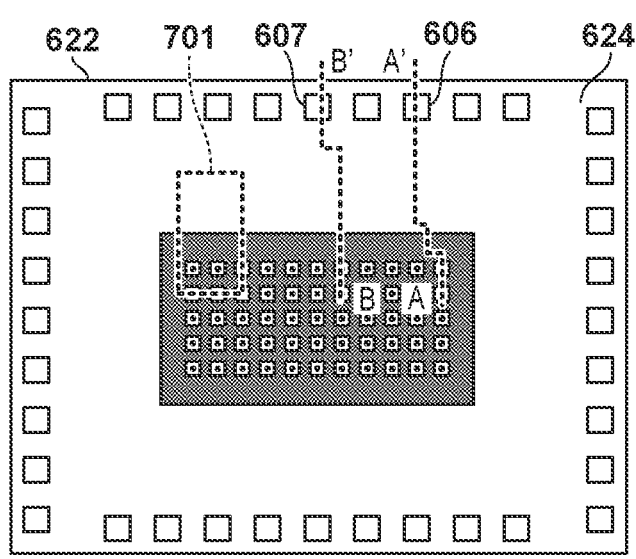
Figure 16D:
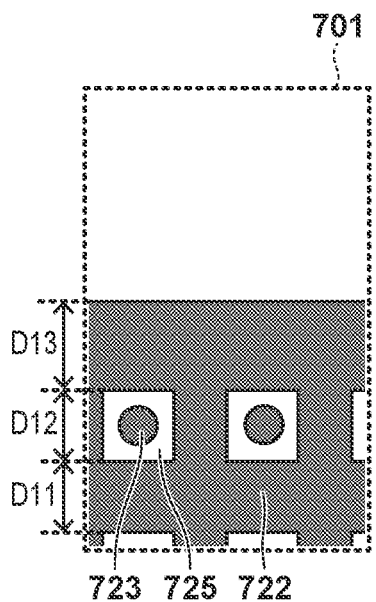
Figure 16E:
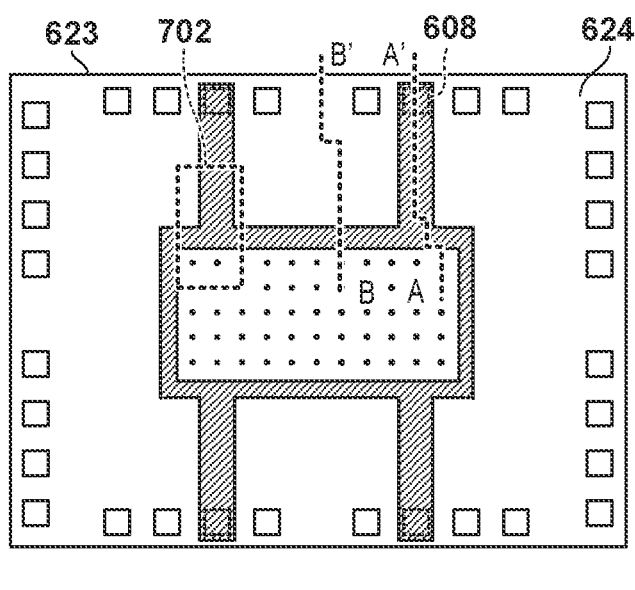
Figure 16F:
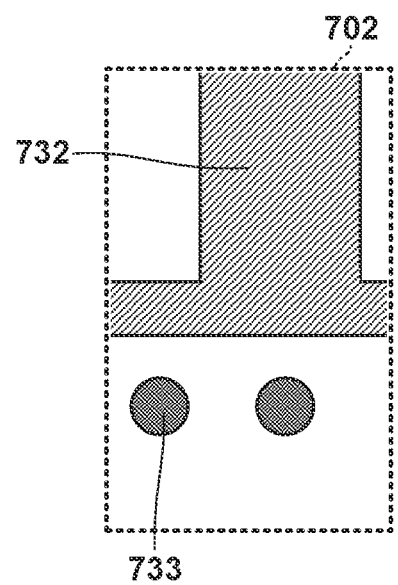

A specific example of the configuration of the photoelectric conversion apparatus 100 according to a third embodiment will be described with reference to FIG. 12. The following descriptions will focus on the differences from the first embodiment. Parts not described here may be similar to those in the first embodiment, or to those in the second embodiment. FIG. 12 corresponds to FIG. 6A from the first embodiment.

The third embodiment differs from the first embodiment in terms of the configuration of the photoelectric conversion element 102. The photoelectric conversion element 102 is constituted by semiconductor regions 1201 to 1205 in addition to the semiconductor regions 611 and 613 described in the first embodiment. The semiconductor region 1205 is flush with the bottom surface of the semiconductor layer 610. The semiconductor region 1205 is of the N-type. The semiconductor region 1204 surrounds the side faces of the semiconductor region 1205. The semiconductor region 1204 is of the N-type. The concentration of the semiconductor region 1204 may be lower than the concentration of the semiconductor region 1205. The semiconductor region 1202 is located above the semiconductor region 1205. The semiconductor region 1202 is of the P-type. The semiconductor region 1203 surrounds the side faces of the semiconductor regions 1202, 1204, and 1205. The semiconductor region 1203 may be of the N-type or the P-type. The semiconductor region 1201 is located above the semiconductor regions 1202 and 1203. The semiconductor region 1201 is of the P-type. The concentration of the semiconductor region 1201 may be lower than the concentration of the semiconductor region 1202. The cathode potential is supplied to the semiconductor region 1205. The anode potential is supplied to the semiconductor region 613. The anode potential supplied to the semiconductor region 613 is also transmitted to the semiconductor regions 1201 and 1202.

Additionally, the pad 608 is formed spanning two wiring layers. In other words, the pad 608 is sufficiently thick compared to the wiring layer located at the same height. This structure makes it possible to reduce the size of the wiring layers while providing resistance to pressure when connecting to external terminals.

Fourth Embodiment

A specific example of the configuration of the photoelectric conversion apparatus 100 according to a fourth embodiment will be described with reference to FIGS. 13A to 14F. The following descriptions will focus on the differences from the first embodiment. Parts not described here may be similar to those in any of the first embodiment to the third embodiment. FIGS. 13A to 14F correspond to FIGS. 6A to 7F, respectively, from the first embodiment.

The fourth embodiment differs from the first embodiment in that the wiring layer 621, not the wiring layer 623, has the pads 608 and 609.

The wiring layer 621 has conductive parts 711 to 713 and 1411. The conductive part 711 is similar to that of the first embodiment, aside from including the pad 609 and being formed of aluminum. The conductive parts 712 and 713 are similar to those of the first embodiment, aside from being formed of aluminum.

The conductive part 1411 is disposed in the peripheral region 602. The conductive part 1411 is responsible for transmitting the anode potential of the APD. The conductive part 1411 is formed of aluminum, for example. The conductive part 1411 includes the pad 608. The wiring layer 621 has a total of four conductive parts 1411, two on each of two sides of the photoelectric conversion apparatus 100. However, the number and location of the conductive parts 1411 are not limited thereto.

The wiring layer 622 has conductive parts 722, 723, and 1421. The conductive parts 722 and 723 are similar to those of the first embodiment. The conductive part 1421 is responsible for transmitting the anode potential of the APD. The conductive part 1421 is formed, for example, of a material which takes copper as its primary component. The wiring layer 622 has a total of four conductive parts 1421, two on each of two sides of the photoelectric conversion apparatus 100. However, the number and location of the conductive parts 1421 are not limited thereto.

The wiring layer 623 has conductive parts 732 and 733. The conductive part 732 is similar to that of the first embodiment, aside from not including the pad 608 and being formed of a material which takes copper as its primary component. The conductive part 733 is similar to that of the first embodiment.

The conductive parts 732, 1411, and 1421 are all responsible for transmitting the anode potential of the APD. The conductive parts 732, 1411, and 1421 are electrically connected to each other. Specifically, the conductive part 1411 and the conductive part 1421 overlap in plan view, and are connected to each other by a plug at a position overlapping the pad 608. The conductive part 1421 and the conductive part 732 overlap in plan view, and are connected to each other by a plug at a position overlapping the pad 608.

When the photoelectric conversion apparatus 100 is in use, the anode potential is supplied to the pad 608 from outside the photoelectric conversion apparatus 100. The anode potential is transmitted by the conductive parts 732, 1411, and 1421 and supplied to the semiconductor layer 610.

Reference Example

The configuration of a photoelectric conversion apparatus according to a reference example will be described with reference to FIGS. 15A to 16F. The following descriptions will focus on the differences from the first embodiment. FIGS. 15A to 16F correspond to FIGS. 6A to 7F, respectively, from the first embodiment. The photoelectric conversion apparatus according to the reference example differs from that of the first embodiment in that the conductive parts 711, 721, and 731 are not provided, but may be similar in other respects.

Variations

In the embodiments described above, the photoelectric conversion apparatus 100 is configured by coupling the sensor substrate 11 and the circuit substrate 12 to each other. Instead, the present disclosure may be applied to a photoelectric conversion apparatus having a configuration in which a wiring structure is connected to a single semiconductor layer in which the photoelectric conversion apparatus and processing circuitry are formed.

Other Embodiments

Figure 17:
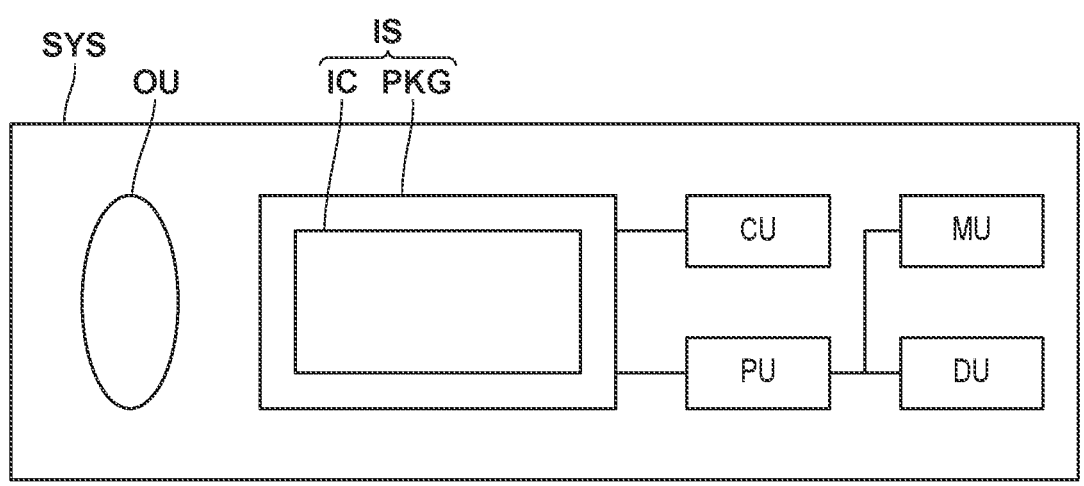
FIG. 17 is a diagram illustrating a photoelectric conversion system according to some embodiments.

An example of a photoelectric conversion system, into which the photoelectric conversion apparatus described through the foregoing embodiments is incorporated, will be described next. FIG. 17 illustrates an example of the photoelectric conversion system. The photoelectric conversion apparatus 100 described above can be applied to various photoelectric conversion systems. A digital still camera, a digital camcorder, a surveillance camera, a copier, a fax machine, a mobile phone, a vehicle-mounted camera, an observation satellite, and the like can be given as examples of such applicable photoelectric conversion systems. A camera module including an optical system such as a lens and an image capturing apparatus is also included in such photoelectric conversion systems.

The photoelectric conversion system is configured, for example, as an image capturing system SYS. The image capturing system SYS is an information terminal having a camera, a photography function, or the like. An image capturing apparatus IS can also be further provided with a package PKG which contains the photoelectric conversion apparatus 100 configured as an image capturing device IC. The package PKG can include a base member to which the image capturing device IC is fixed, a lid member facing the image capturing device IC, and a connecting member that connects terminals provided on the base body to terminals provided on the image capturing device IC. The image capturing apparatus IS can also have a plurality of image capturing device ICs mounted side-by-side in a common package PKG. The image capturing apparatus IS can also be mounted in a common package PKG with the image capturing device IC and other semiconductor device ICs stacked on top of each other.

The image capturing system SYS can include an optical system OU that forms an image on the image capturing apparatus IS. The image capturing system SYS can include at least one of a control unit CU that controls the image capturing apparatus IS; a processing unit PU that processes signals obtained from the image capturing apparatus IS; and a display unit DU that displays images obtained from the image capturing apparatus IS. The image capturing system SYS may also include a memory unit MU that stores images obtained from the image capturing apparatus IS.

Figure 18A:
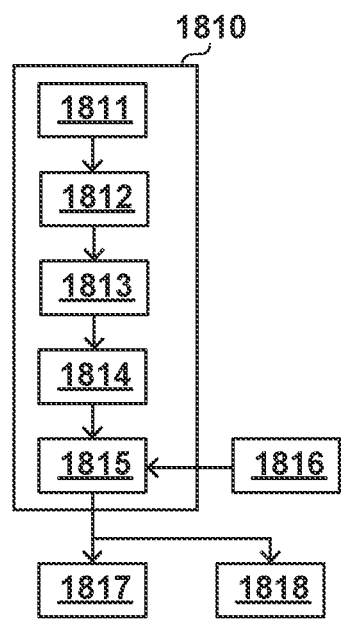
FIGS. 18A and 18B are diagrams illustrating a photoelectric conversion system according to some embodiments.

FIG. 18A illustrates an example of an image capturing system 1810 related to a vehicle-mounted camera. The image capturing system 1810 includes a photoelectric conversion apparatus 1811. The photoelectric conversion apparatus 1811 may be any one of the photoelectric conversion apparatuses from the foregoing embodiments. The image capturing system 1810 includes an image processing unit 1812, which is a processing device that performs image processing on a plurality of instances of image data obtained by the photoelectric conversion apparatus 1811. The image capturing system 1810 also includes a parallax obtainment unit 1813, which is a processing device that calculates parallax (a phase difference in a parallax image) from the plurality of instances of image data obtained by the photoelectric conversion apparatus 1811.

Furthermore, the image capturing system 1810 includes a distance obtainment unit 1814, which is a processing device that calculates the distance to a target object based on the calculated parallax, and a collision determination unit 1815, which is a processing device that determines whether a collision may occur based on the calculated distance. Here, the parallax obtainment unit 1813 and the distance obtainment unit 1814 are examples of an information obtainment unit that obtains information such as distance information indicating a distance to a target object. In other words, the distance information is information about parallax, a defocus amount, a distance to the target object, or the like. The collision determination unit 1815 may use any of these types of distance information to determine the likelihood of a collision. The various processing devices described above may be realized by specially-designed hardware or by general-purpose hardware that performs operations based on software modules. The processing units may be realized by FPGAs, ASICs, or the like, or by a combination thereof.

The image capturing system 1810 is connected to a vehicle information obtainment apparatus 1816, which can obtain vehicle information such as vehicle speed, yaw rate, steering angle, and the like. The image capturing system 1810 is also connected to a control ECU 1817, which is a control device that outputs a control signal for generating braking force for the vehicle based on a result of the determination made by the collision determination unit 1815. In other words, the control ECU 1817 is an example of a moving body control unit that controls a moving body based on distance information. The image capturing system 1810 is also connected to a warning apparatus 1818 that warns a driver based on the result of the determination made by the collision determination unit 1815. For example, when the collision determination unit 1815 determines that the possibility of a collision is high, the control ECU 1817 performs vehicle control to avoid the collision or reduce damage by applying the brakes, returning the accelerator pedal, reducing engine output, or the like. The warning apparatus 1818 warns the user by sounding an alarm such as a sound, displaying warning information on the screen of a car navigation system or the like, vibrating the seatbelt or steering wheel, or the like.

Figure 18B:
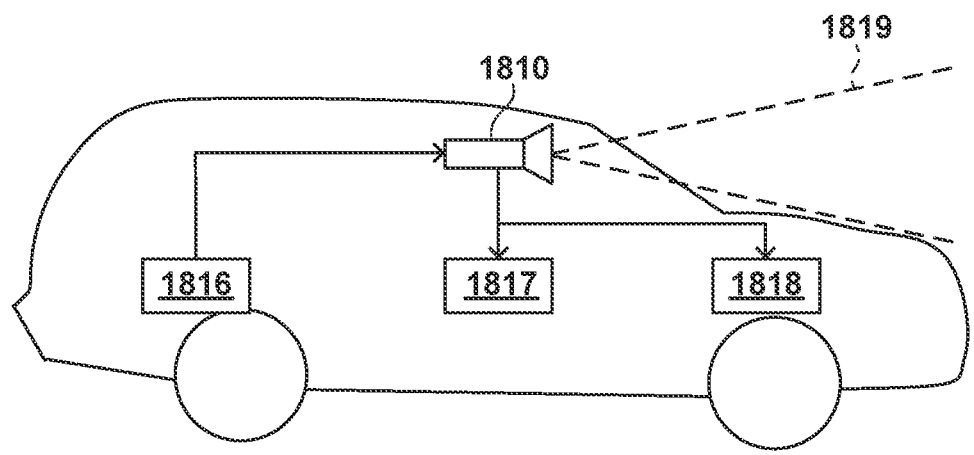

In the present embodiment, the surroundings of the vehicle, e.g., the front or rear of the vehicle, are captured by the image capturing system 1810. FIG. 18B illustrates the image capturing system 1810 for a case where the front of the vehicle (an image capture range 1819) is captured. The vehicle information obtainment apparatus 1816 transmits instructions to the image capturing system 1810 to operate and capture images.

Although the foregoing describes an example of control performed to prevent collisions with other vehicles, the foregoing can also be applied to control for automatic driving that follows other vehicles, automatic driving that avoids departing from a lane, and the like. Furthermore, the image capturing system is not limited to vehicles such as automobiles, and can be applied to other moving bodies (transportation equipment) such as ships, aircraft, industrial robots, and the like, for example. The movement devices in a moving body (transportation equipment) are various moving parts such as engines, motors, wheels, propellers, and the like. In addition to moving bodies, the present embodiment can be broadly applied to devices that use object recognition, such as Intelligent Transport Systems (ITS) and the like.

Figure 19:
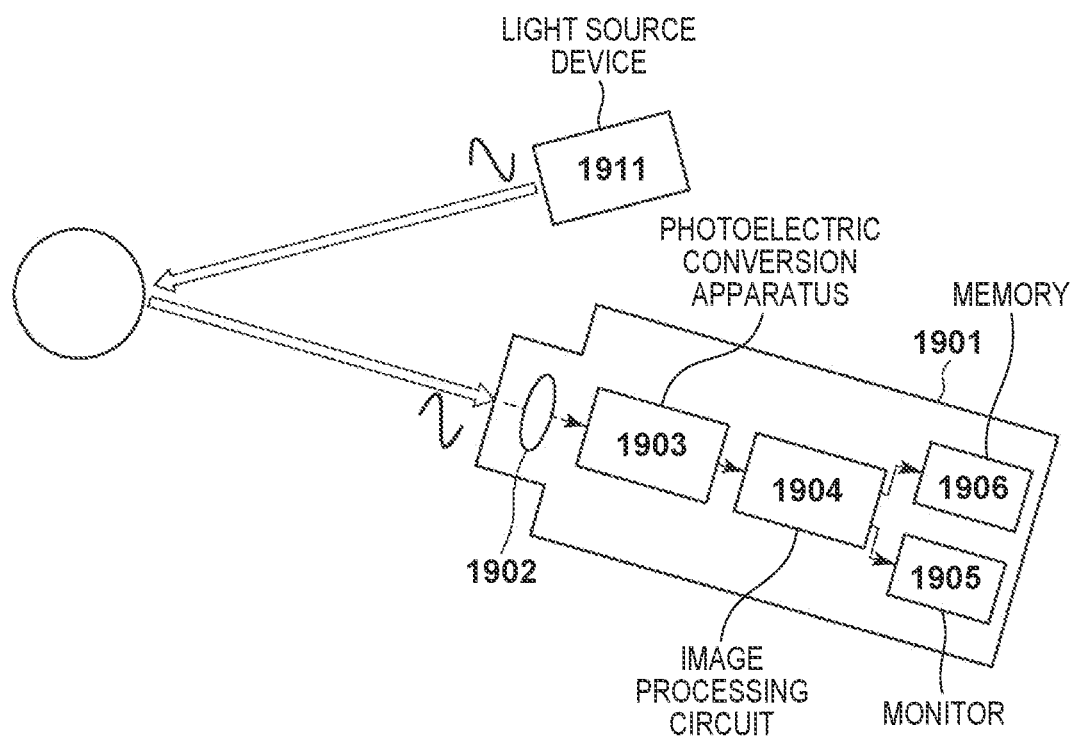
FIG. 19 is a diagram illustrating a photoelectric conversion system according to some embodiments.

FIG. 19 illustrates an example of a photoelectric conversion system configured as a range image sensor. The range image sensor 1901 includes an optical system 1902, a photoelectric conversion apparatus 1903, an image processing circuit 1904, a monitor 1905, and memory 1906. The range image sensor 1901 can obtain a range image corresponding to the distance to a subject by receiving light (modulated light, pulsed light, or the like) which has been projected from a light source device 1911 toward the subject and reflected by the surface of the subject.

The optical system 1902 is constituted by one or more lenses, and directs image light (incident light) from the subject to the photoelectric conversion apparatus 1903 and forms an image on a light-receiving surface (sensor unit) of the photoelectric conversion apparatus 1903. The photoelectric conversion apparatus of any of the foregoing embodiments is applied as the photoelectric conversion apparatus 1903, and a range signal indicating the distance obtained from a received light signal output from the photoelectric conversion apparatus 1903 is supplied to the image processing circuit 1904.

The image processing circuit 1904 performs image processing to construct a range image based on the range signal supplied by the photoelectric conversion apparatus 1903. The range image (image data) obtained through the image processing is then supplied to the monitor 1905 for display or to the memory 1906 for storage (recording). With the range image sensor 1901 configured in this manner, the improvement in pixel characteristics achieved by applying the above-described photoelectric conversion apparatus makes it possible to obtain a more accurate range image, for example.

Figure 20:
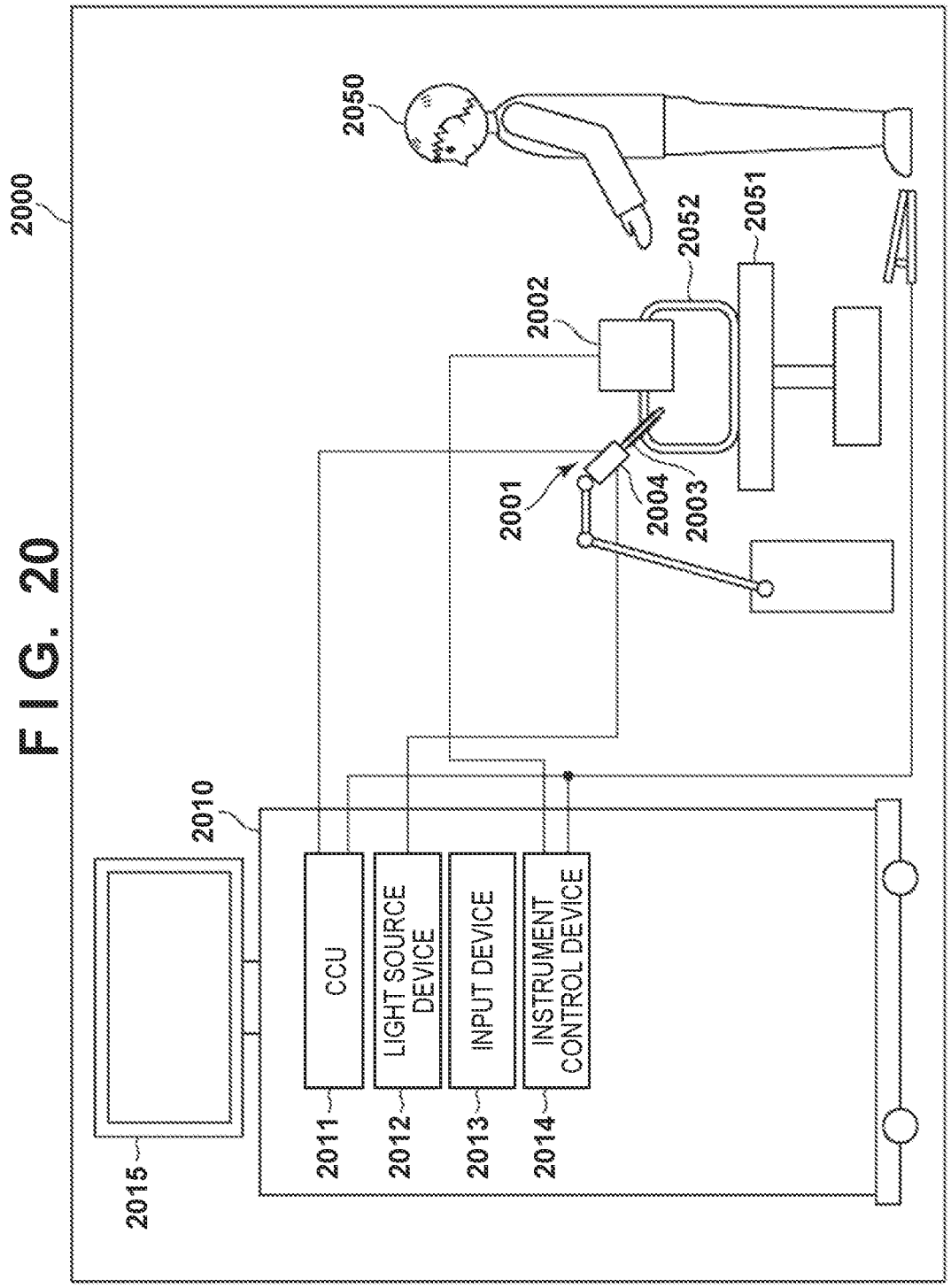
FIG. 20 is a diagram illustrating a photoelectric conversion system according to some embodiments.

FIG. 20 illustrates an example of a photoelectric conversion system configured as an endoscopic surgery system. FIG. 20 illustrates a surgeon (doctor) 2050 performing surgery on a patient 2052 on a patient bed 2051 using an endoscopic surgery system 2000. As illustrated here, the endoscopic surgery system 2000 is configured including an endoscope 2001, a surgical instrument 2002, and a cart 2010 equipped with various devices used for endoscopic surgery.

The endoscope 2001 is configured including a lens barrel 2003 inserted to a predetermined length into a body cavity of the patient 2052 from the tip, and a camera head 2004, which is connected to a base of the lens barrel 2003. Here, the example illustrates the endoscope 2001 being configured as what is known as a rigid mirror with a rigid lens barrel 2003, but the endoscope 2001 may also be configured as what is known as a flexible mirror with a flexible lens barrel.

The tip of the lens barrel 2003 has an opening into which an objective lens is fitted. A light source device 2012 is connected to the endoscope 2001, and light generated by the light source device 2012 is guided to the tip of the lens barrel by a light guide extending inside the lens barrel 2003 and directed through the objective lens to irradiate an object for observation in the body cavity of the patient 2052. Note that the endoscope 2001 may be a direct-, oblique-, or lateral-view endoscope.

An optical system and a photoelectric conversion apparatus are provided within the camera head 2004, and reflected light (observation light) from the object for observation is focused by the optical system onto the photoelectric conversion apparatus. The observation light is photoelectrically converted by the photoelectric conversion apparatus, and an electrical signal corresponding to the observation light, i.e., an image signal corresponding to an observation image, is generated. The photoelectric conversion apparatus described in any of the foregoing embodiments can be used as the photoelectric conversion apparatus. The image signal is transmitted as RAW data to a camera control unit (CCU) 2011.

The CCU 2011 is constituted by a Central Processing Unit (CPU), a Graphics Processing Unit (GPU), and the like, and controls the overall operations of the endoscope 2001 and a display device 2015. Furthermore, the CCU 2011 receives the image signal from the camera head 2004 and performs various types of image processing on the image signal, such as development processing (demosaicing), for example, to display an image based on the image signal.

The display device 2015 displays an image based on the image signal subjected to the image processing by the CCU 2011, under the control of the CCU 2011. The light source device 2012 is constituted by a light source such as a Light Emitting Diode (LED) or the like, for example, and supplies irradiation light to the endoscope 2001 when capturing an image of the surgical site or the like. An input device 2013 is an input interface for the endoscopic surgery system 2000. A user can input various types of information and instructions to the endoscopic surgery system 2000 through the input device 2013. An instrument control device 2014 controls driving of the surgical instrument 2002 (e.g., an energy treatment tool) for cauterizing tissue, making incisions, sealing blood vessels, or the like.

The light source device 2012 that supplies the endoscope 2001 with the irradiation light when capturing an image of the surgical site can be constituted by, for example, a white light source including an LED, a laser light source, or a combination thereof. When a white light source is constituted by a combination of RGB laser light sources, the output intensity and output timing of each color (each wavelength) can be controlled with high precision, and thus the white balance of the captured image can be adjusted in the light source device 2012. In this case, by irradiating the object for observation with laser light from each of the RGB laser light sources in time-division and controlling the driving of the image sensor in the camera head 2004 in synchronization with that irradiation timing, images corresponding to each of the RGB colors can be captured in time-division as well. According to this method, color images can be obtained even without providing the image sensor with a color filter.

Additionally, the driving of the light source device 2012 may be controlled to change the intensity of the output light every predetermined interval. By controlling the driving of the image sensor of the camera head 2004 and obtaining an image through time-division in synchronization with the timing at which the intensity of the light is changed, and then compositing those images, a high-dynamic range image without blocked-up shadows or blowouts can be generated.

The light source device 2012 may be configured to supply provide light in a predetermined wavelength band corresponding to special light observation. Special light observation uses, for example, the wavelength dependence of light absorption by body tissues. Specifically, high-contrast images of predetermined tissues such as blood vessels in the mucosal surface layer are captured by irradiating the area with light having a narrower bandwidth than the irradiation light used during normal observation (i.e., white light). Alternatively, in special light observation, fluorescence imaging may be used to obtain an image from fluorescence generated by emitting excitation light. In fluorescence imaging, body tissue is irradiated with excitation light and the fluorescence from the body tissue is observed, or a reagent such as indocyanine green (ICG) is injected into the body tissue and the tissue is irradiated with excitation light corresponding to the fluorescence wavelength of the reagent to obtain a fluorescent image. The light source device 2012 can be configured to supply narrow-band and/or excitation light corresponding to such special light observation.

Figure 21A:
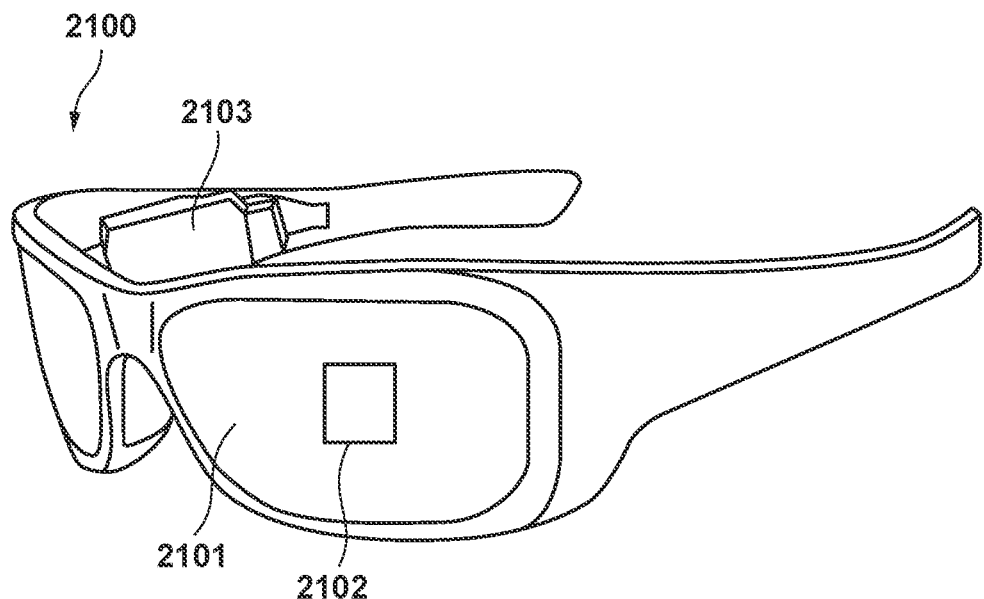
FIGS. 21A and 21B are diagrams illustrating a photoelectric conversion system according to some embodiments.

FIG. 21A illustrates an example of the configuration of a photoelectric conversion system configured as a pair of eyeglasses 2100 (smart glasses). The eyeglasses 2100 include a photoelectric conversion apparatus 2102 to which the photoelectric conversion apparatus 100 is applied. The photoelectric conversion apparatus 2102 is the photoelectric conversion apparatus described in any of the foregoing embodiments. A display device including light-emitting devices such as OLEDs, LEDs, or the like may be provided on a rear side of a lens 2101. One or more photoelectric conversion apparatus 2102 may be provided. Additionally, a plurality of types of photoelectric conversion apparatuses may be used in combination with each other. The position where the photoelectric conversion apparatus 2102 is provided is not limited to that illustrated in FIG. 21A.

The eyeglasses 2100 are further provided with a control device 2103. The control device 2103 functions as a power source that supplies power to the photoelectric conversion apparatus 2102 and the aforementioned display device. The control device 2103 also controls the operations of the photoelectric conversion apparatus 2102 and the display device. An optical system for focusing light onto the photoelectric conversion apparatus 2102 is formed in the lens 2101.

Figure 21B:
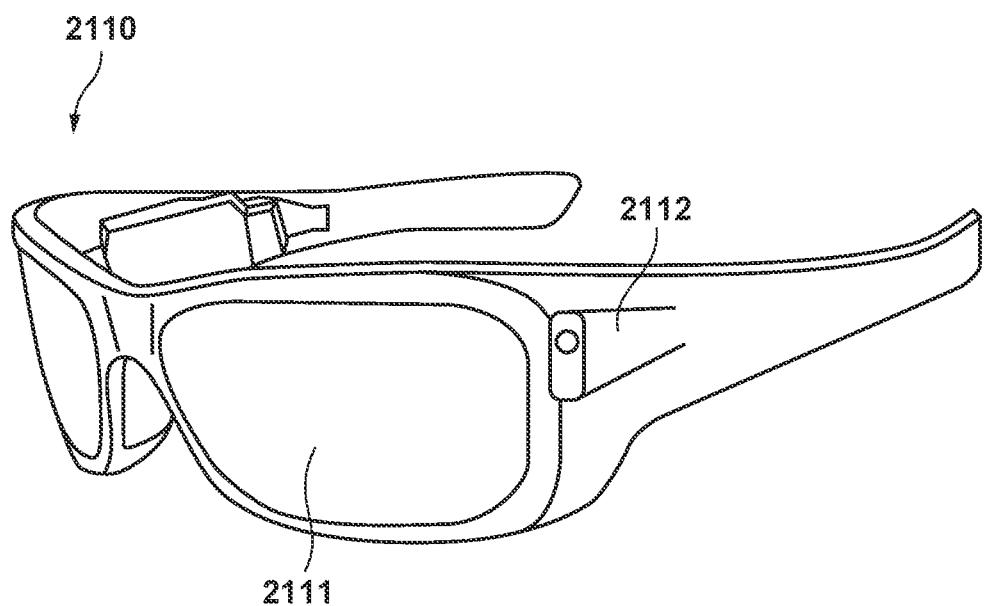

FIG. 21B illustrates an example of the configuration of a photoelectric conversion system configured as a pair of eyeglasses 2110 (smart glasses). The eyeglasses 2110 include a control device 2112, and the control device 2112 is provided with a photoelectric conversion apparatus corresponding to the photoelectric conversion apparatus 2102 and a display device. An optical system for projecting light emitted from the photoelectric conversion apparatus and the display device within the control device 2112 is formed in a lens 2111, and an image is projected onto the lens 2111. The control device 2112 functions as a power source that supplies power to the photoelectric conversion apparatus and the display device, and also controls the operations of the photoelectric conversion apparatus and the display device. The control device may include a gaze detection unit that detects a wearer's gaze. Infrared light may be used for the gaze detection. An infrared light emission unit emits infrared light toward the eyeball of a user gazing at the displayed image. Of the emitted infrared light, reflected light from the eyeball is detected by an image capturing unit having a light-receiving element, and a captured image is obtained. Providing a reduction means that reduces the light from the infrared light emission unit to the display area in plan view reduces a drop in the image quality.

The user's gaze with respect to the displayed image is detected from the captured image of the eyeball obtained from capturing the image of infrared light. Any publicly-known method can be used for the gaze detection using a captured image of the eyeball. For example, a gaze detection method based on a Purkinje image produced by the reflection of irradiation light at the cornea can be used. More specifically, gaze detection processing is performed based on a pupil-corneal reflection method. Using the pupil-corneal reflection method, the user's gaze is detected by calculating a gaze vector, which represents the orientation (rotation angle) of the eyeball, based on an image of the pupil and a Purkinje image in the captured image of the eyeball.

The display device of the present embodiment may include a photoelectric conversion apparatus having a light-receiving element, and may control the displayed image in the display device based on the user's gaze information from the photoelectric conversion apparatus.

Specifically, based on the gaze information, a first visual field region at which the user gazes and a second visual field region outside the first visual field region are determined in the display device. The first visual field region and the second visual field region may be determined by a control device in the display device, or regions determined by an external control device may be received. In a display region of the display device, the display resolution of the first visual field region may be controlled to be higher than the display resolution of the second visual field region. In other words, the resolution of the second visual field region may be lower than that of the first visual field region.

Additionally, the display region may include a first display region and a second display region that is different from the first display region, and a region of high priority may be determined from the first display region and the second display region based on the gaze information. The first display region and the second display region may be determined by a control device in the display device, or regions determined by an external control device may be received. The resolution of the region of high priority may be controlled to be higher than the resolution of regions aside from the region of high priority. In other words, the resolution may be lowered for regions of relatively low priority.

Note that AI may be used to determine the first visual field region, the region of high priority, and the like. The AI may be a model configured to estimate the angle of the gaze and a distance to an object being gazed upon from an image of an eyeball, using images of eyeballs and the directions in which the eyeballs in those images are actually gazing as supervisory data. The AI program may be held in the display device, the photoelectric conversion apparatus, or an external device. If held in an external device, the program may be provided to the display device through communication.

When controlling a display based on visibility detection, the configuration may be applied to smart glasses that further include a photoelectric conversion apparatus that captures images of the outside. The smart glasses can display the captured outside information in real time.

Figure 22A:
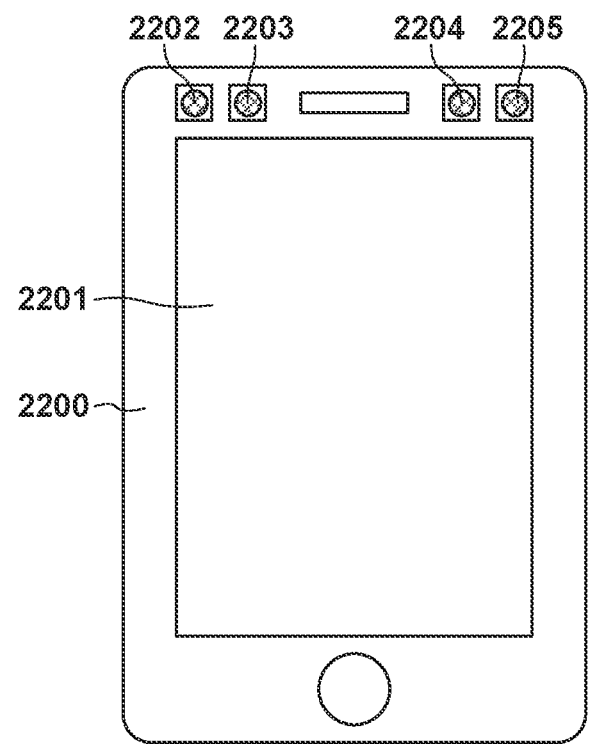
FIGS. 22A and 22B are diagrams illustrating a photoelectric conversion system according to some embodiments.
Figure 22B:
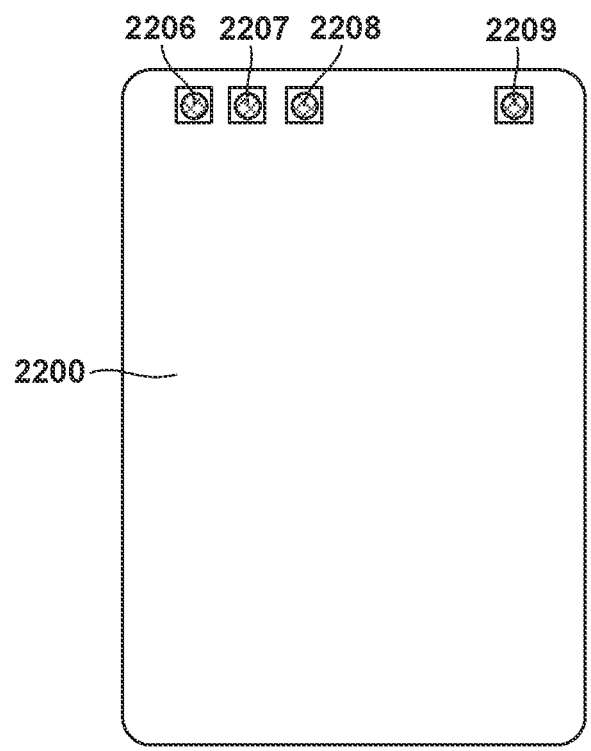

The photoelectric conversion apparatus 100 of the foregoing embodiments may be applied in an electronic device such as a smartphone, a tablet, or the like, as will be described below. FIGS. 22A and 22B illustrate an example of the appearance of an electronic device 2200 in which the photoelectric conversion apparatus 100, configured as a solid-state image capturing apparatus, is installed. FIG. 22A illustrates the front side of the electronic device 2200, and FIG. 22B illustrates the rear side of the electronic device 2200.

As illustrated in FIG. 22A, a display 2201 which displays images is disposed in the center of the front side of the electronic device 2200. Front cameras 2202 and 2205 which use the photoelectric conversion apparatus 100, an IR light source 2203 that emits infrared light, and a visible light source 2204 that emits visible light are disposed along an upper edge of the front side of the electronic device 2200.

Meanwhile, as illustrated in FIG. 22B, rear cameras 2206 and 2209 which use the photoelectric conversion apparatus 100, an IR light source 2207 that emits infrared light, and a visible light source 2208 that emits visible light are disposed along an upper edge of the rear side of the electronic device 2200.

In the electronic device 2200 configured in this manner, applying the above-described photoelectric conversion apparatus 100 makes it possible to capture images at higher sensitivities, for example. Note that the photoelectric conversion apparatus 100 can be applied in other electronic devices, such as infrared sensors, range sensors using active infrared light sources, security cameras, personal or biometric authentication cameras, and the like. This makes it possible to improve the sensitivity, performance, and the like of those electronic devices. In addition, the power consumption of the system can be reduced by a reduction in the light source power.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-000008, filed Jan. 1, 2022, which is hereby incorporated by reference herein in its entirety.

What is claimed is:

1. A photoelectric conversion apparatus, comprising;
a semiconductor layer having an avalanche photodiode; and
a wiring structure electrically connected to the semiconductor layer,
wherein in a plan view relative to a boundary between the semiconductor layer and the wiring structure, the photoelectric conversion apparatus comprises:
a pixel region including the avalanche photodiode; and
a peripheral region located between the pixel region and an outer edge of the photoelectric conversion apparatus,
wherein the wiring structure includes a first wiring layer, a second wiring layer, and a third wiring layer,
the third wiring layer is located between the first wiring layer and the second wiring layer,
the first wiring layer includes, in the peripheral region, a first conductive part for transmitting an anode potential of the avalanche photodiode,
the second wiring layer includes, in the peripheral region, a second conductive part for transmitting a second potential different from the anode potential, and
the first conductive part and the second conductive part overlap in the plan view.

2. The photoelectric conversion apparatus according to claim 1,
wherein the second wiring layer is located between the third wiring layer and the semiconductor layer.

3. The photoelectric conversion apparatus according to claim 1,
wherein the wiring structure does not include another wiring layer between the second wiring layer and the semiconductor layer.

4. The photoelectric conversion apparatus according to claim 1,
wherein the second potential falls within a range centered on a ground potential, with a cathode potential of the avalanche photodiode at one end of the range.

5. The photoelectric conversion apparatus according to claim 4,
wherein the second potential is equal to the cathode potential of the avalanche photodiode.

6. The photoelectric conversion apparatus according to claim 4,
wherein the second potential is equal to the ground potential.

7. The photoelectric conversion apparatus according to claim 1,
wherein a potential difference between the anode potential and the second potential is no less than 15 V and no greater than 50 V.

8. The photoelectric conversion apparatus according to claim 1,
wherein the semiconductor layer includes, in the peripheral region, a charge discharge part that collects a charge of the semiconductor layer, and
the second conductive part is connected to the charge discharge part.

9. The photoelectric conversion apparatus according to claim 1,
wherein the third wiring layer does not include a conductive part in a location where the first conductive part and the second conductive part overlap in the plan view.

10. The photoelectric conversion apparatus according to claim 1,
wherein the third wiring layer includes a third conductive part that overlaps with the first conductive part and the second conductive part in the plan view.

11. The photoelectric conversion apparatus according to claim 10,
wherein no potential is supplied to the third conductive part.

12. The photoelectric conversion apparatus according to claim 10,
wherein a third potential is supplied to the third conductive part, the third potential falling within a range which is centered on an average value of the anode potential and the second potential and which has a width of half a difference between the anode potential and the second potential.

13. The photoelectric conversion apparatus according to claim 1,
wherein the second conductive part includes a mesh-shaped part.

14. The photoelectric conversion apparatus according to claim 1,
wherein the first wiring layer further includes a pad facing outside the photoelectric conversion apparatus.

15. The photoelectric conversion apparatus according to claim 1,
wherein the second wiring layer includes, in the pixel region, a fourth conductive part for transmitting the anode potential, and
the second conductive part and the fourth conductive part are separated from each other.

16. A photoelectric conversion system comprising:
the photoelectric conversion apparatus according to claim 1; and
a signal processing unit that processes a signal output by the photoelectric conversion apparatus.

17. A photoelectric conversion apparatus, comprising;
a semiconductor layer having an avalanche photodiode; and
a wiring structure electrically connected to the semiconductor layer,
wherein in a plan view relative to a boundary between the semiconductor layer and the wiring structure, the photoelectric conversion apparatus comprises:

a pixel region including the avalanche photodiode; and a peripheral region located between the pixel region and an outer edge of the photoelectric conversion apparatus, wherein the wiring structure includes a first wiring layer, a second wiring layer, and a third wiring layer, the third wiring layer is located between the first wiring layer and the second wiring layer, the first wiring layer includes, in the peripheral region, a first conductive part for transmitting an anode potential of the avalanche photodiode, the second wiring layer includes, in the peripheral region, a second conductive part for transmitting a second potential different from the anode potential, the first conductive part and the second conductive part overlap in the plan view, and the third wiring layer does not include a conductive part in a location where the first conductive part and the second conductive part overlap in the plan view.

18. A photoelectric conversion system comprising:
the photoelectric conversion apparatus according to claim 17; and
a signal processing unit that processes a signal output by the photoelectric conversion apparatus.

19. A photoelectric conversion apparatus, comprising;
a semiconductor layer having an avalanche photodiode; and
a wiring structure electrically connected to the semiconductor layer, wherein in a plan view relative to a boundary between the semiconductor layer and the wiring structure, the photoelectric conversion apparatus comprises:

a pixel region including the avalanche photodiode; and a peripheral region located between the pixel region and an outer edge of the photoelectric conversion apparatus, wherein the wiring structure includes a first wiring layer, a second wiring layer, and a third wiring layer, the third wiring layer is located between the first wiring layer and the second wiring layer, the first wiring layer includes, in the peripheral region, a first conductive part for transmitting an anode potential of the avalanche photodiode, the second wiring layer includes, in the peripheral region, a second conductive part for transmitting a second potential different from the anode potential, the first conductive part and the second conductive part overlap in the plan view, the third wiring layer includes a third conductive part that overlaps with the first conductive part and the second conductive part in the plan view, and no potential is supplied to the third conductive part.

20. A photoelectric conversion system comprising:
the photoelectric conversion apparatus according to claim 19; and
a signal processing unit that processes a signal output by the photoelectric conversion apparatus.

* * * * *